(12) United States Patent
Paik et al.

(10) Patent No.: US 11,747,941 B2
(45) Date of Patent: Sep. 5, 2023

(54) TOUCH DISPLAY DEVICE

(71) Applicant: LG Display Co., Ltd., Seoul (KR)

(72) Inventors: SangYoon Paik, Paju-si (KR); SeoungJin Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/149,480

(22) Filed: Jan. 3, 2023

(65) Prior Publication Data

US 2023/0146191 A1 May 11, 2023

Related U.S. Application Data

(63) Continuation of application No. 17/378,332, filed on Jul. 16, 2021, now Pat. No. 11,567,608.

(30) Foreign Application Priority Data

Oct. 30, 2020 (KR) .................. 10-2020-0142768

(51) Int. Cl.
| | |
|---|---|
| *G09G 3/30* | (2006.01) |
| *G09G 3/36* | (2006.01) |
| *G06F 3/041* | (2006.01) |
| *G06F 3/044* | (2006.01) |
| *G02F 1/1333* | (2006.01) |
| *G02F 1/1362* | (2006.01) |
| *G02F 1/1335* | (2006.01) |
| *G02F 1/1339* | (2006.01) |
| *G02F 1/1343* | (2006.01) |

(52) U.S. Cl.
CPC ...... *G06F 3/04184* (2019.05); *G02F 1/13338* (2013.01); *G02F 1/13398* (2021.01); *G02F 1/133512* (2013.01); *G02F 1/136222* (2021.01); *G06F 3/0412* (2013.01); *G06F 3/0443* (2019.05); *G02F 1/134318* (2021.01); *G02F 1/134363* (2013.01)

(58) Field of Classification Search
CPC ..... G06F 3/04184; G06F 3/041–04184; G06F 2203/04103; G02F 1/13338; G02F 1/136222
See application file for complete search history.

(56) References Cited

U.S. PATENT DOCUMENTS

| | | |
|---|---|---|
| 2015/0370116 A1 | 12/2015 | Chae et al. |
| 2016/0131938 A1 | 5/2016 | Ji et al. |
| 2018/0143711 A1* | 5/2018 | Ono ................ G02F 1/13338 |
| 2019/0187852 A1* | 6/2019 | Jin ................ G06F 3/0446 |
| 2020/0091247 A1 | 3/2020 | Lee et al. |

* cited by examiner

*Primary Examiner* — Sanghyuk Park
(74) *Attorney, Agent, or Firm* — Fenwick & West LLP

(57) ABSTRACT

Embodiments of the present disclosure are related to a touch display device, as implementing a portion of a touch link line by using a metal disposed on a layer different from a layer where a data link line is disposed and disposing a color filter layer between the touch link line and the data link line, a plurality of link lines can be disposed effectively and a parasitic capacitance between the touch link line and the data link line can be reduced. Furthermore, as blocking a light of specific wavelength band by the color filter layer, a light-leakage due to an abnormal driving of a display according to a driving of the touch link line on an area where the touch link line is disposed can be prevented or at least reduced.

20 Claims, 24 Drawing Sheets

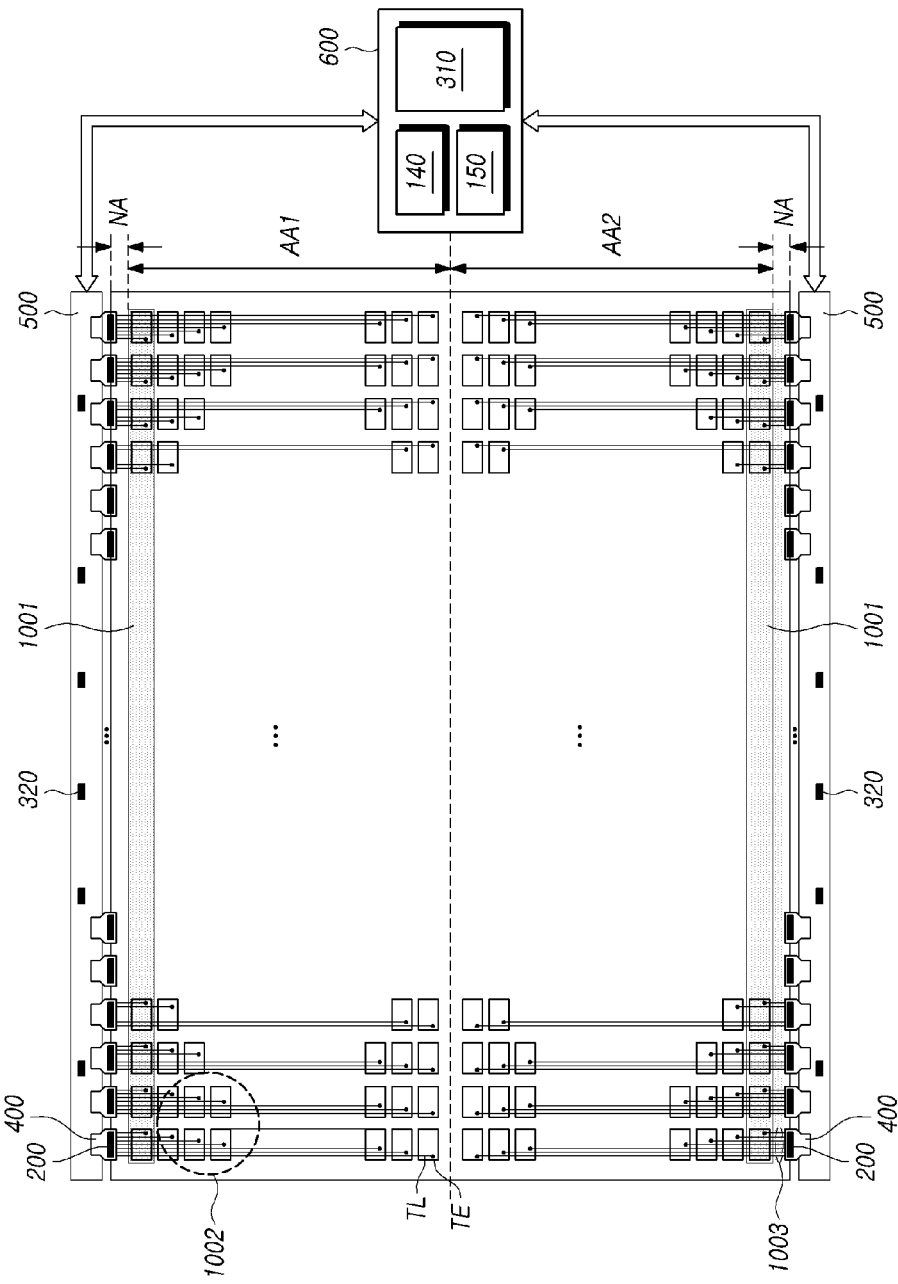

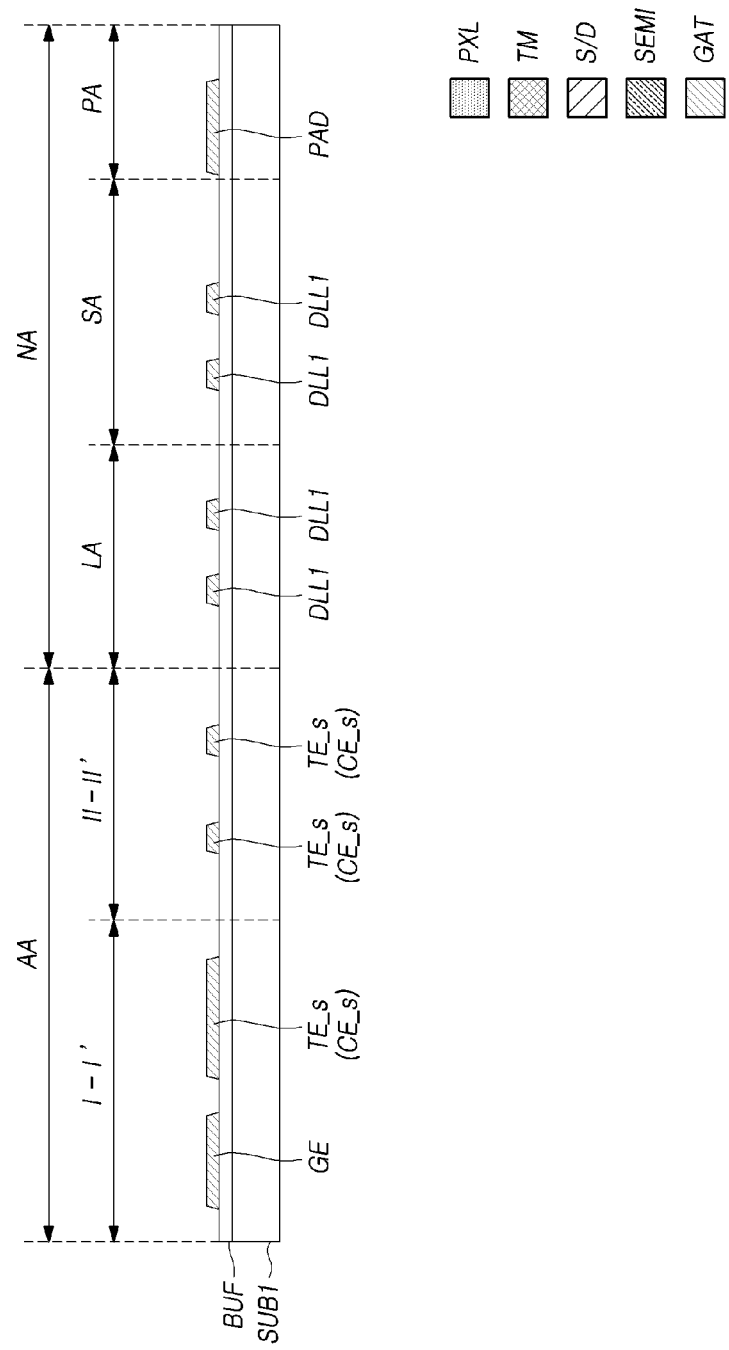

TOUCH DISPLAY DEVICE

CROSS REFERENCE TO RELATED APPLICATION

This application is a continuation of U.S. patent application Ser. No. 17/378,332 filed on Jul. 16, 2021, which claims priority from Republic of Korea Patent Application No. 10-2020-0142768, filed on Oct. 30, 2020, each of which is hereby incorporated by reference in its entirety.

BACKGROUND

Field

Embodiments of the present disclosure are related to a touch display device.

Description of Related Art

The growth of the information society leads to an increased demand for display devices to display images and use of various types of display devices, such as liquid crystal display devices, organic light emitting display devices, etc.

The display devices, for proving more various functions to the user, provide a function that recognizes a touch by a finger or a pen of a user on a display panel and performs an input process based on the recognized touch.

The display devices capable of recognizing the touch, for example, can include a plurality of touch electrodes disposed on the display panel, or embedded in the display panel. The display devices can perform a touch sensing by driving the plurality of touch electrodes and detecting a change of a capacitance that is occurred when touching of the user to the display panel.

The display devices can include a touch driving circuit driving the plurality of touch electrodes, and a plurality of touch lines electrically connecting between each of the plurality of touch electrodes and the touch driving circuit.

As the display devices includes various electrodes and signal lines for display driving other than a component for the touch sensing, a parasitic capacitance is formed between the touch line and the signal line or the like for the display driving. Furthermore, noise is generated in a touch sensing signal detected through the touch line by the parasitic capacitance.

Especially, the touch line and the signal line for the display driving can be disposed densely on a link area or a pad area where the touch line and the touch driving circuit are connected to each other. Thus, the noise of the touch sensing signal can increase due to the parasitic capacitance of the signal line for the display driving, resulting in a decrease of touch sensing accuracy.

SUMMARY

Embodiments of the present disclosure provide methods being capable of disposing a signal line for a touch sensing and a signal line for a display driving on a non-active area of a display panel effectively.

Embodiments of the present disclosure provide methods being capable of reducing a noise of a touch sensing signal by the signal line for the display driving on the non-active area of the display panel.

Embodiments of the present disclosure provide methods being capable of reducing an abnormality of the display driving due to an arrangement of the signal line for the touch sensing.

In an aspect, embodiments of the present disclosure can provide a touch display device including a plurality of touch electrodes and a plurality of touch lines disposed on an active area, a plurality of touch pads disposed on a non-active area located outside of the active area, a plurality of touch link lines including a first touch link line disposed on the non-active area and electrically connected to one of the plurality of touch pads and a second touch link line disposed on a layer different from a layer where the first touch link line is disposed and electrically connecting the first touch link line and one of the plurality of touch lines each other, and a plurality of data link lines disposed on a layer different from a layer where the second touch link line is disposed on the non-active area.

The touch display device can further include at least one color filter layer disposed on at least a part area of the non-active area and located between the layer where the second touch link line is disposed and a layer where the data link line is disposed.

The at least one color filter layer can include a color filter layer which transmits a light of a first wavelength band and blocks a light of a wavelength band other than the first wavelength band.

The touch display device can further include at least one black column spacer located on at least a part area of an area overlapping with the at least one color filter layer, and a transmittance of the at least one black column spacer transmitting the light of the wavelength band other than the first wavelength band is greater than a transmittance of the at least one black column spacer transmitting the light of the first wavelength band.

Here, the light of the first wavelength band can be a blue light.

Each of the plurality of data link lines can include a first data link line disposed on the layer where the first touch link line is disposed, and a second data link line disposed on a layer different from the layer where the first touch link line is disposed and electrically connecting the first data link line and one of a plurality of data lines disposed on the active area.

A portion of the second touch link line can overlap a portion of the first data link line. And the second touch link line and the second data link line may not overlap each other.

In another aspect, embodiments of the present disclosure can provide a touch display device including a substrate including an active area and a non-active area, a plurality of data link lines disposed on the non-active area on the substrate, at least one color filter layer disposed on the non-active area and located on the plurality of data link lines, and a plurality of touch link lines located on the at least one color filter layer at least partially and overlapping with a portion of at least one of the plurality of data link lines.

According to various embodiments of the present disclosure, as disposing a portion of a touch link line on a different layer from a data link line and differentiating a point that portions of the touch link line are connected and a point that portions of the data link line are connected, the touch link line and the data link line can be disposed effectively on a non-active area.

According to various embodiments of the present disclosure, as disposing at least one color filter layer between the touch link line and the data link line, a parasitic capacitance between the touch link line and the data link line can be reduced.

According to various embodiments of the present disclosure, as disposing at least one color filter layer to overlap with the touch link line on the non-active area, a light-leakage of a display panel due to an increase of an electric field by the touch link line can be prevented.

BRIEF DESCRIPTION OF THE DRAWINGS

The above and other objects, features, and advantages of the present disclosure will be more clearly understood from the following detailed description, taken in conjunction with the accompanying drawings, in which:

FIG. 2 is a diagram schematically illustrating a configuration for a touch sensing of a touch display device according to embodiments of the present disclosure.

FIGS. 11A to 11G are diagrams illustrating examples of a cross-sectional structure of an active area and a non-active area of a touch display device according to embodiments of the present disclosure.

DETAILED DESCRIPTION

Figure 1:
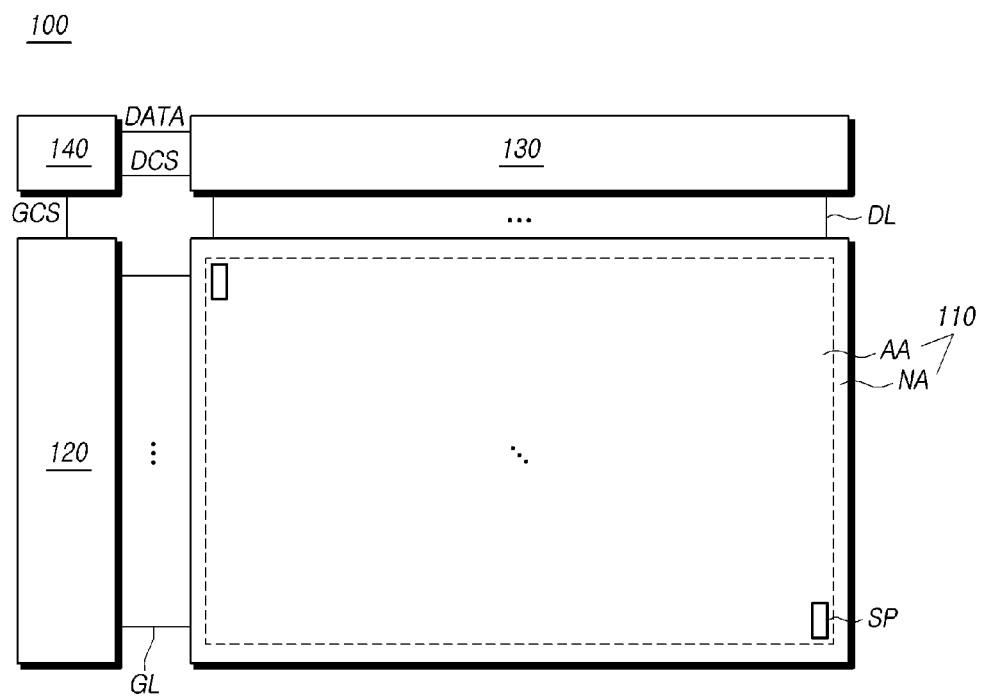
FIG. 1 is a diagram schematically illustrating a configuration for a display driving of a touch display device according to embodiments of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear.

The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

FIG. 1 is a diagram schematically illustrating a configuration for a display driving of a touch display device 100 according to embodiments of the present disclosure. FIG. 2 is a diagram schematically illustrating a configuration for a touch sensing of the touch display device 100 according to embodiments of the present disclosure.

Referring to FIGS. 1 and 2, the touch display device 100 can include a display panel 110 including an active area AA that displays an image and a non-active area NA that does not display an image, a gate driving circuit 120, a data driving circuit 130 and a controller 140 or the like for driving the display panel 110.

A plurality of gate lines GL and a plurality of data lines DL can be arranged on the display panel 110, and a plurality of subpixels SP can be located in areas where the gate lines GL and the data lines DL intersect each other.

The gate driving circuit 120 is controlled by the controller 140, and sequentially outputs scan signals to the plurality of gate lines GL arranged on the display panel 110, thereby controlling the driving timing of the plurality of subpixels SP.

The gate driving circuit 120 can include one or more gate driver integrated circuits GDIC, and can be located only at one side of the display panel 110, or can be located at both sides thereof according to a driving method.

Each gate driver integrated circuit GDIC can be connected to a bonding pad of the display panel 110 by a tape automated bonding TAB method or a chip-on-glass COG method. Alternatively, each gate driver integrated circuit GDIC can be implemented by a gate-in-panel GIP method to then be directly arranged on the display panel 110. Alternatively, each gate driver integrated circuit GDIC, in some cases, can be integrated and arranged on the display panel 110. Alternatively, each gate driver integrated circuit GDIC can be implemented by a chip-on-film COF method in which an element is mounted on a film connected to the display panel 110.

The data driving circuit 130 receives image data from the controller 140 and converts the image data into an analog data voltage Vdata. The data driving circuit 130 outputs the data voltage Vdata to each data line DL according to the timing at which the scan signal is applied through the gate line GL so that each of the plurality of subpixels SP emits light having brightness according to the image data.

The data driving circuit 130 can include one or more source driver integrated circuits SDIC.

Each source driver integrated circuit SDIC can include a shift register, a latch circuit, a digital-to-analog converter, an output buffer, and the like.

Each source driver integrated circuit SDIC can be connected to a bonding pad of the display panel 110 by a tape automated bonding TAB method or a chip-on-glass COG method. Alternatively, each source driver integrated circuit SDIC can be directly disposed on the display panel 110. Alternatively, each source driver integrated circuit SDIC, in some cases, can be integrated and arranged on the display panel 110. Alternatively, each source driver integrated circuit SDIC can be implemented by a chip-on-film COF method. In this case, each source driver integrated circuit SDIC can be mounted on a film connected to the display panel 110, and can be electrically connected to the display panel 110 through wires on the film.

The controller 140 supplies various control signals to the gate driving circuit 120 and the data driving circuit 130, and controls the operations of the gate driving circuit 120 and the data driving circuit 130.

The controller 140 can be mounted on a printed circuit board, a flexible printed circuit, or the like, and can be electrically connected to the gate driving circuit 120 and the data driving circuit 130 through the printed circuit board, the flexible printed circuit, or the like.

The controller 140 can allow the gate driving circuit 120 to output a scan signal according to the timing implemented in each frame. The controller 140 can convert a data signal received from the outside to conform to the data signal format used in the data driving circuit 130 and then output the converted image data to the data driving circuit 130.

The controller 140 receives, from the outside (e.g., a host system), various timing signals including a vertical synchronization signal VSYNC, a horizontal synchronization signal HSYNC, an input data enable DE signal, a clock signal CLK, and the like, as well as the image data.

The controller 140 can generate various control signals using various timing signals received from the outside, and can output the control signals to the gate driving circuit 120 and the data driving circuit 130.

For example, in order to control the gate driving circuit 120, the controller 140 can output various gate control signals GCS including a gate start pulse GSP, a gate shift clock GSC, a gate output enable signal GOE, or the like.

The gate start pulse GSP controls operation start timing of one or more gate driver integrated circuits GDIC constituting the gate driving circuit 120. The gate shift clock GSC, which is a clock signal commonly input to one or more gate driver integrated circuits GDIC, controls the shift timing of a scan signal. The gate output enable signal GOE specifies timing information on one or more gate driver integrated circuits GDIC.

In addition, in order to control the data driving circuit 130, the controller 140 can output various data control signals DCS including a source start pulse SSP, a source sampling clock SSC, a source output enable signal SOE, or the like.

The source start pulse SSP controls a data sampling start timing of one or more source driver integrated circuits SDIC constituting the data driving circuit 130. The source sampling clock SSC is a clock signal for controlling the timing of sampling data in the respective source driver integrated circuits SDIC. The source output enable signal SOE controls the output timing of the data driving circuit 130.

The touch display device 100 can further include a power management integrated circuit 150 for supplying various voltages or currents to the display panel 110, the gate driving circuit 120, the data driving circuit 130, and the like or controlling various voltages or currents to be supplied thereto.

Each of the plurality of subpixels SP can be an area defined by the intersection of the gate line GL and the data line DL, and depending on types of he touch display device 100, a liquid crystal or a light-emitting element can be disposed on the subpixel SP.

For example, in the case that the touch display device 100 is a liquid crystal display device, including a light-source device such as a backlight unit irradiating a light to the display panel 110, a liquid crystal is disposed on the subpixel SP of the display panel 110. And as adjusting an arrangement of the liquid crystal by an electric field made according that the data voltage Vdata is applied to each subpixel SP, each subpixel SP can represent a luminance according to the image data and display an image.

For another example, in the case that the touch display device 100 is an organic light-emitting display device, an organic light-emitting diode OLED and a plurality of circuit elements can be disposed on each of the plurality of subpixels SP. By controlling a current supplied to the organic light-emitting diode OLED disposed on the subpixel SP, each subpixel SP can represent a luminance corresponding to the image data.

Alternatively, the light-emitting element disposed on the subpixel SP can be a light-emitting diode LED or micro light-emitting diode μLED.

For convenience of the description, the touch display device 100 according to embodiments of the present disclosure is described as the liquid crystal display device as an example, but not limited to this.

The touch display device 100 can include a plurality of touch electrodes TE disposed on the display panel 110, or embedded in the display panel 110. In the case that the touch electrode TE is embedded in the display panel 110, the touch electrode TE can be an electrode disposed separately from an electrode for the display driving, or can be an electrode that a signal or a voltage for the display driving is supplied.

For example, the touch electrode TE can be a common electrode CE embedded in the display panel 110, and supplied with a common voltage for the display driving. In this case, the common electrode CE disposed on the display panel 110 can be divided as a plurality of electrodes. By supplying the common voltage for the display driving or a touch driving signal for the touch sensing to the plurality of divided electrodes, display driving or the touch sensing can be performed.

The touch display device 100 can include a touch line TL electrically connected to the touch electrode TE, and a touch driving circuit 200 driving the touch electrode TE and the touch line TL. The touch driving circuit 200 can supply a touch driving signal to the touch electrode TE and receive a touch sensing signal from the touch electrode TE.

The touch driving circuit 200 can detect a change of a capacitance based the touch sensing signal received from the touch electrode TE, and transmit a sensing data according to a result detected to a touch controller.

The touch driving circuit 200, for example, can be disposed on a film 400 connected between the display panel 110 and a source printed circuit board 500. The touch driving circuit 200, in some cases, can be implemented as a circuit integrated with the data driving circuit 130.

The touch controller can control a driving of the touch driving circuit 200, and detect a presence or an absence of a touch, a touch coordinate based on the sensing data received from the touch driving circuit 200.

The touch controller, in some cases, can include a first touch controller 310 disposed on a control printed circuit board 600, and a plurality of second touch controller 320 disposed on the source printed circuit board 500. Each of the plurality of second touch controller 320 can control the driving of two or more touch driving circuit 200. And the first touch controller 310 can control the driving of the plurality of second touch controller 320.

In the example illustrated in FIG. 2, in the case that the touch display device 100 has a large area, the touch controller can include the first touch controller 310 and the plurality of second touch controller 320 for controlling of the plurality of touch electrodes TE and the plurality of touch driving circuit 200.

For example, the active area AA is divided as a first active area AA1 and a second active area AA2, and the touch display device 100 can include the touch driving circuit 200 and the second touch controller 320 for driving the plurality of touch electrodes TE disposed on the first active area AA1, and the touch driving circuit 200 and the second touch controller 320 for driving the plurality of touch electrodes TE disposed on the second active area AA2.

In some cases, such as an area indicated by 1001 illustrated in FIG. 2, an area where the touch electrode TE having a different size from the touch electrode TE disposed on a different area is disposed can be present. In the case that the common electrode CE embedded in the display panel 110 is divided and used as the touch electrode TE, an area where a size of the divided touch electrode TE is not same according to the number of the subpixel SP can be present. In this case, the touch electrode TE whose size or shape is different can be disposed on an area adjacent to a boundary of the active area AA.

The touch electrode TE disposed on the display panel 110 can be electrically connected to the touch line TL, and can be driven by the touch driving circuit 200.

Figure 3A:
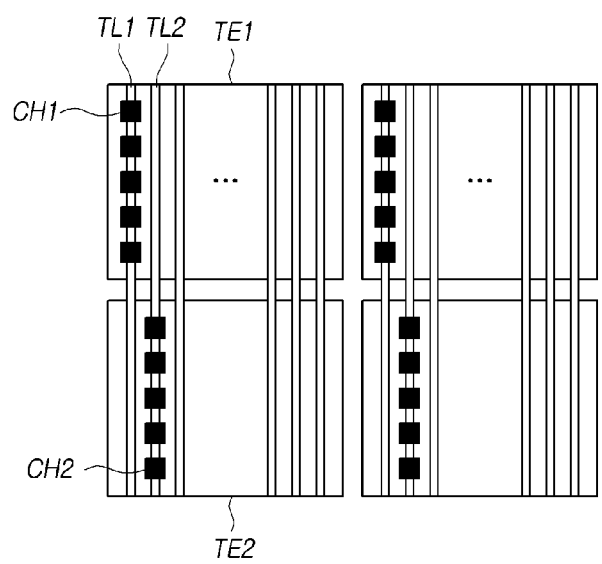
FIGS. 3A and 3B are diagrams illustrating examples of a structure of a touch electrode disposed in a touch display device according to embodiments of the present disclosure.
Figure 3B:
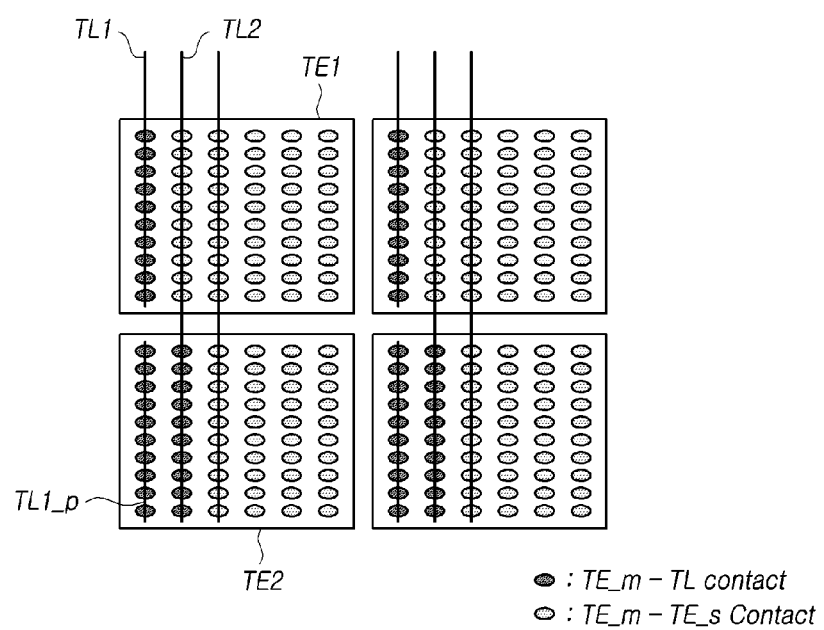

FIGS. 3A and 3B are diagrams illustrating examples of a structure of the touch electrode TE disposed in the touch display device 100 according to embodiments of the present disclosure, they illustrate exemplarily an area indicated by 1002 illustrated in FIG. 2.

Referring to FIG. 3A, the plurality of touch lines TL can be disposed on a first touch electrode TE1 and a second touch electrode TE2 divided from each other. The example illustrated in FIG. 3A illustrates a case that the touch line TL is disposed over the touch electrode TE, but the touch line TL can be disposed under the touch electrode TE.

A first touch line TL1 of the plurality of touch lines TL disposed on the first touch electrode TE1 and the second touch electrode TE2 can be electrically connected to the first touch electrode TE1 through a first contact-hole CH1. And a second touch line TL2 of the plurality of touch lines TL disposed on the first touch electrode TE1 and the second touch electrode TE2 can be electrically connected to the second touch electrode TE2 through a second contact-hole CH2.

Thus, by disposing the plurality of touch lines TL in a same pattern and electrically connecting to the touch electrode TE to which a connection is required through the contact-hole, a connection structure of the touch electrode TE and the touch line TL can be implemented.

Alternatively, the touch line TL can be disposed as a disconnected structure, without extending to an area after the touch electrode TE to which the touch line TL is connected.

Referring to FIG. 3B, the plurality of touch lines TL can be disposed over or under the first touch electrode TE1 and the second touch electrode TE2.

The first touch line TL1 of the plurality of touch lines TL can be electrically connected to the first touch electrode TE1. Furthermore, a first touch line pattern TL1_p located on an extending line of the first touch line TL1 and overlapped with the second touch electrode TE2 can be separated from the first touch line TL1. A plurality of first touch line patterns TL1_p can be disposed on the extending line of the first touch line TL1, and the plurality of first touch line pattern TL1_p can be separated and disposed as overlapping with a plurality of touch electrodes TE, respectively.

The first touch line pattern TL1_p can be electrically connected to the second touch electrode TE2. By electrically connecting the first touch line pattern TL1_p disposed to be separated from the first touch line TL with the second touch electrode TE2, a resistance of the second touch electrode TE2 can be reduced.

The second touch line TL2 can overlap with the first touch electrode TE1 and the second touch electrode TE2, and electrically connected to the second touch electrode TE2. Although not illustrated in FIG. 3B, a touch line pattern separated from the second touch line TL2 and electrically connected to other touch electrode can be present on an area after an area where the second touch line TL2 and the second touch electrode TE2 are connected.

The touch electrode TE, in some cases, can include a main touch electrode TE_m and a sub touch electrode TE_s. the main touch electrode TE_m and the sub touch electrode TE_s can be disposed on different layers.

The main touch electrode TE_m can be electrically connected to the sub touch electrode TE_s through the contact-hole at each predetermined point. And the main touch electrode TE_m can be electrically connected to the touch line TL at a point electrically connected to the sub touch electrode TE_s or other point.

Figure 4A:
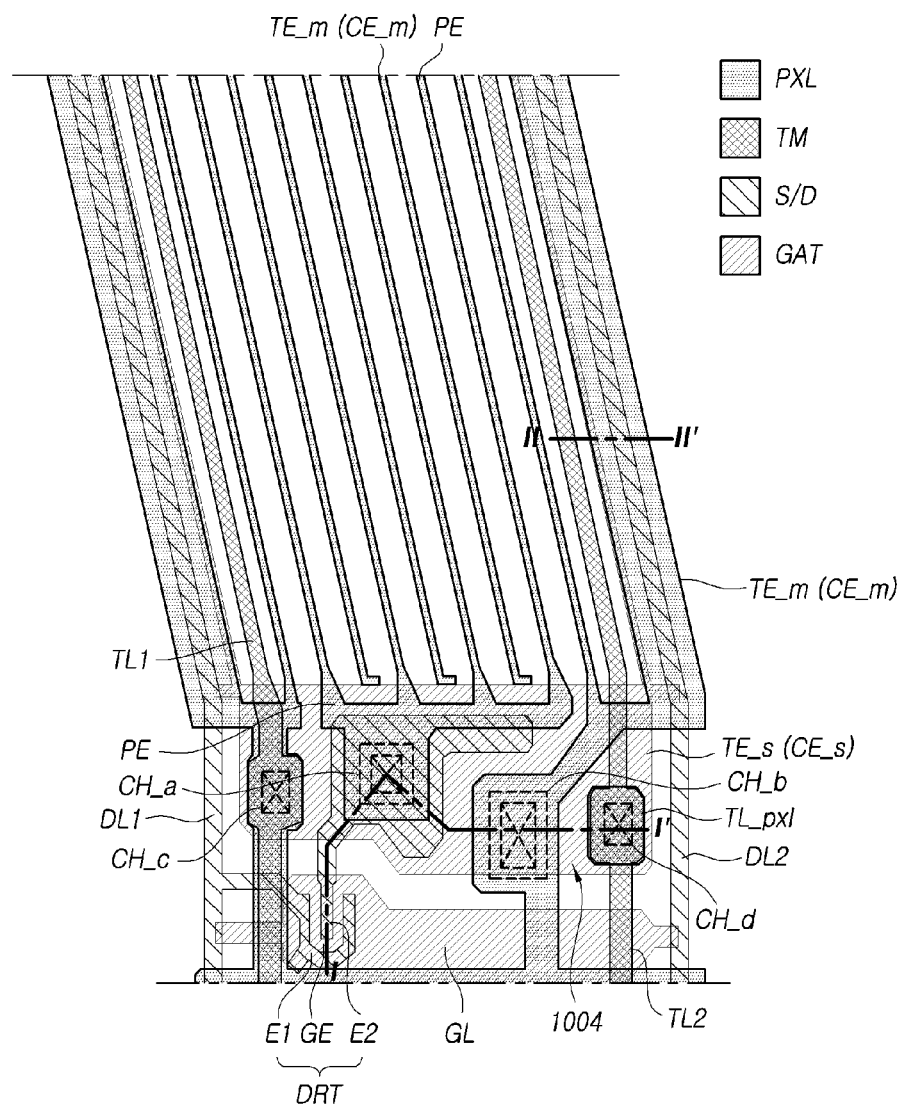
FIGS. 4A and 4B are diagrams illustrating examples of a structure of a subpixel disposed in a touch display device according to embodiments of the present disclosure.
Figure 4B:
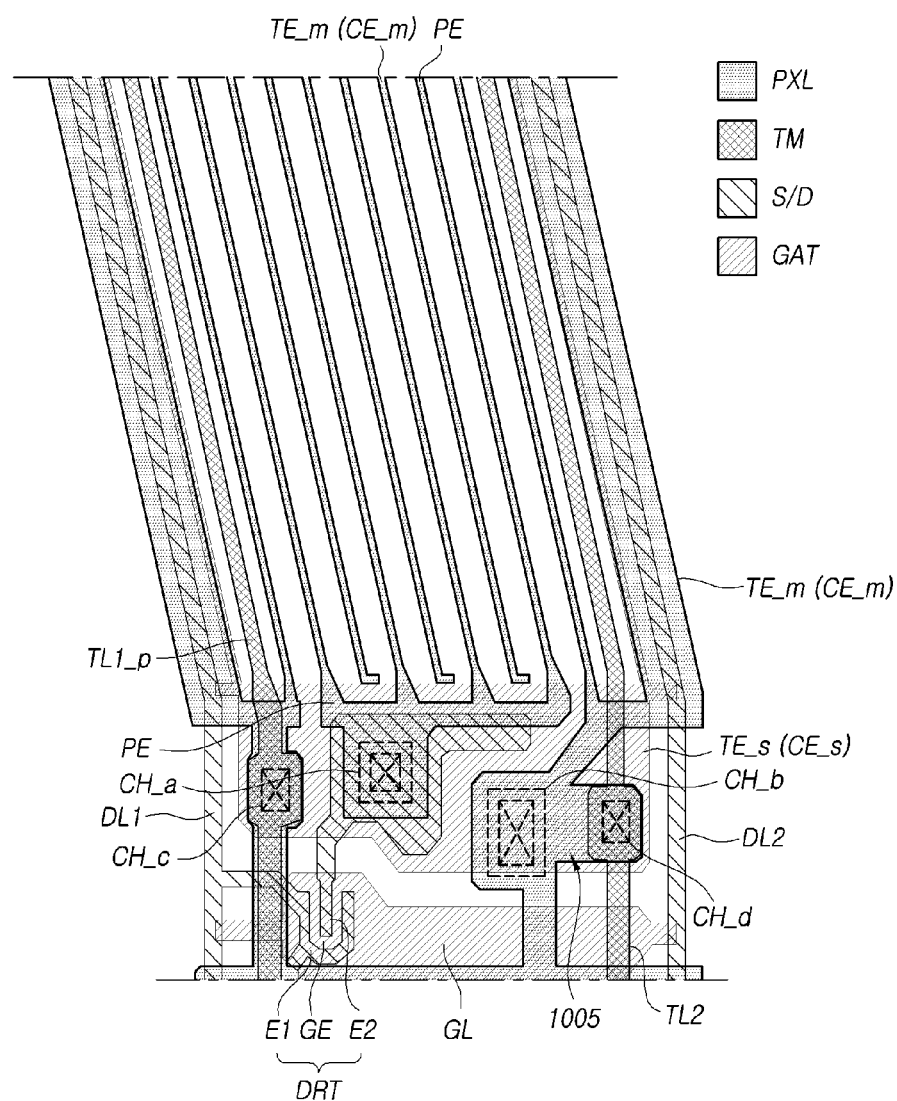

FIGS. 4A and 4B are diagrams illustrating examples of a structure of the subpixel SP disposed in the touch display device 100 according to embodiments of the present disclosure.

FIG. 4A illustrates a portion where the first touch line TL1 is electrically connected to the touch electrode TE, and FIG. 4B illustrates a portion where the second touch line TL2 is electrically connected to the touch electrode TE.

Referring to FIGS. 4A and 4B, the gate line GL supplied with the scan signal and made of a gate metal GAT can be disposed on the subpixel SP. Furthermore, the data line DL supplied with the data voltage Vdata and made of a source/drain metal S/D can be disposed on the subpixel SP to cross the gate line GL. FIGS. 4A and 4B illustrate examples of the subpixel SP disposed between a first data line DL1 and a second data line DL2, and being driven by the first data line DL1.

A driving transistor DRT can be disposed on an area where the gate line GL and a first data line DL1 cross.

The driving transistor DRT can include a gate electrode GE, a first electrode E1 and a second electrode E2. The gate electrode GE can be electrically connected to the gate line GL, or can be integral with the gate line GL. The first electrode E1 can be electrically connected to the first data line DL1, or can be integral with the first data line DL1. The second electrode E2 can be electrically connected to a pixel electrode PE through a contact-hole CH_a.

The pixel electrode PE can be made of a pixel metal PXL. A main common electrode CE_m made of the pixel metal PXL and separated from the pixel electrode PE can be disposed on a layer where the pixel electrode PE is disposed. The main common electrode CE_m can be the main touch electrode TE_m.

A sub common electrode CE_s made of the gate metal GAT can be disposed on a layer different from a layer where the main common electrode CE_m is disposed. The sub common electrode CE_s can be electrically connected to the main common electrode CE_m through a contact-hole CH_b.

The sub common electrode CE_s can be disposed to overlap with a portion of the second electrode E2 of the driving transistor DRT and the pixel electrode PE and can make a capacitance.

Each of the main common electrode CE_m and the sub common electrode CE_s can be driven as the main touch electrode TE_m and the sub touch electrode TE_s.

The touch line TL disposed along a direction that the data line DL is disposed and disposed not to be overlapped with the data line DL can be electrically connected to the touch electrode TE and drive the touch electrode TE.

Referring to FIG. 4A, the first touch line TL1 can be electrically connected to the main touch electrode TE_m through a contact-hole CH_c.

The second touch line TL2, such as an area indicated by 1004, may not be connected to the main touch electrode TE_m. A touch line part TL_pxl made of the pixel metal PXL can be disposed on the second touch line TL2. The second touch line TL2 and the touch line part TL_pxl can be electrically connected through a contact-hole CH_d.

Referring to FIG. 4B, the first touch line pattern TL1_p can be electrically connected to the main touch electrode TE_m through the contact-hole CH_c. Thus, the first touch line pattern TL1_p located on an extending line of the first touch line TL1 and separated from the first touch line TL1 can constitute a portion of the touch electrode TE.

The second touch line TL2, such as an area indicated by 1005, can be electrically connected to the main touch electrode TE_m. The touch line part TL_pxl disposed on the second touch line TL2 in FIG. 4A can be integral with the main touch electrode TE_m, and a connection structure of the second touch line TL2 and the main touch electrode TE_m can be implemented.

Such as described above, as embodiments of the present disclosure use the common electrode CE disposed on the active area AA as the touch electrode TE, a touch sensing function can be implemented without adding a separate component in the display panel 110.

Furthermore, such as illustrated in FIGS. 4A and 4B, as the touch line TL electrically connected to the touch electrode TE is disposed not to overlap with the data line DL, a parasitic capacitance between the touch line TL and the data line DL can be reduced.

Thus, a noise of the touch sensing signal and a performance drop of the touch sensing due to the parasitic capacitance can be prevented or at least reduced.

Meanwhile, on the non-active area NA of the display panel 110, an arrangement of a link line electrically connecting between the touch line TL or the data line DL and a driving circuit may not be easy.

In the example illustrated in FIG. 2 described above, it can be easy that the touch line TL and the data line DL are disposed not to be overlapped with each other on the active area AA such as an area indicated by 1002, but the parasitic capacitance between the link lines can increase according to that a plurality of link lines are connected to the driving circuit on the non-active area NA such as an area indicated by 1003.

The parasitic capacitance between a touch link line TLL electrically connecting between the touch line TL and the touch driving circuit 200 and a data link line DLL electrically connecting between the data line DL and the data driving circuit 130 can increase on the non-active area NA of the display panel 110.

Embodiments of the present disclosure provide methods being capable of reducing the parasitic capacitance by a planar and a vertical arrangement structure of the touch link line TLL and the data link line DLL on the non-active area NA.

Furthermore, embodiments of the present disclosure provide methods being capable of preventing or at least reducing an occurrence of an abnormality of the display driving according due to the plurality of touch link line TLL being disposed on the non-active area NA.

Figure 5:
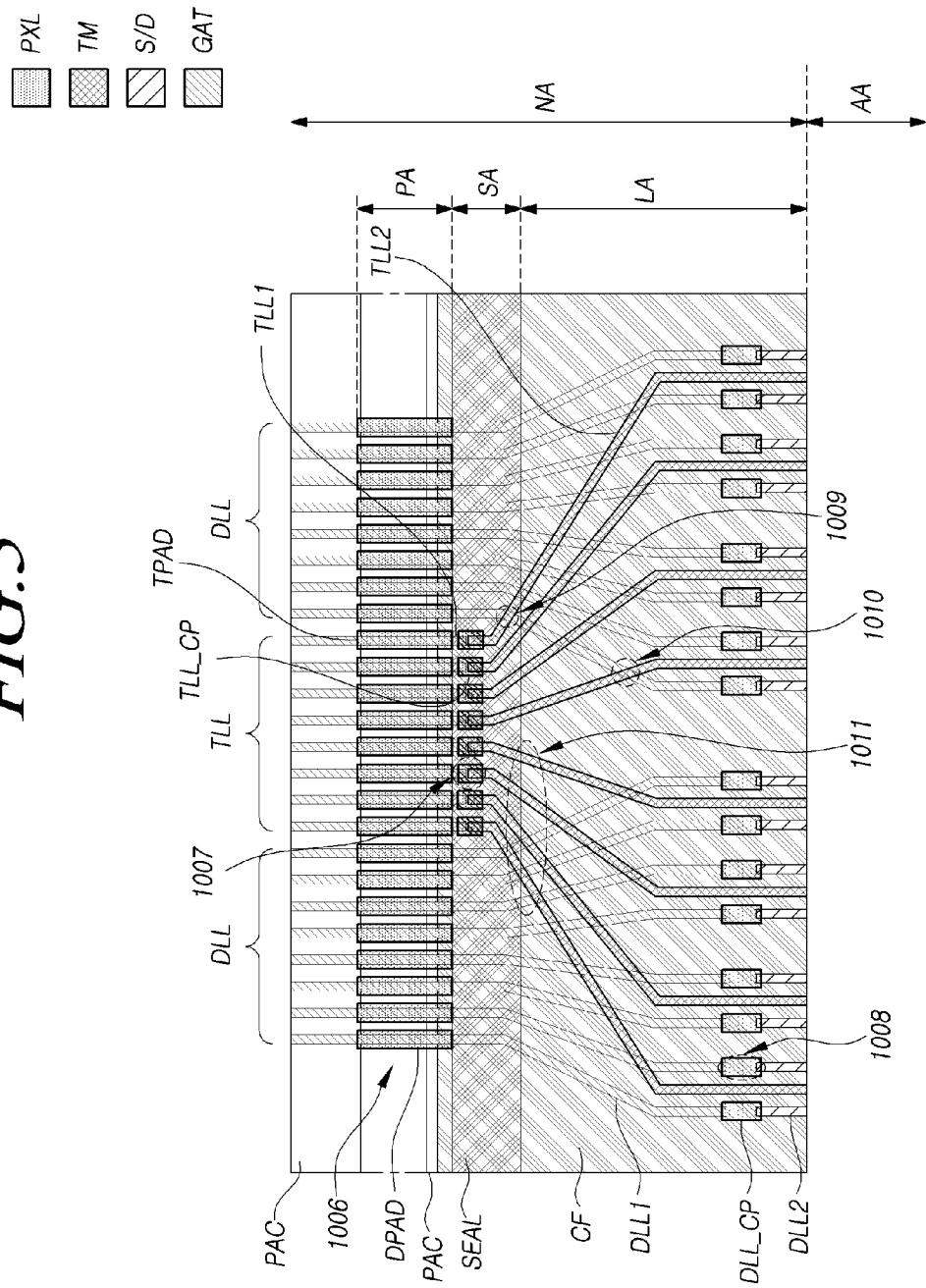
FIG. 5 is a diagram illustrating an example of a plane structure of a touch link line and a data link line disposed on a non-active area of a touch display device according to embodiments of the present disclosure.
Figure 6:
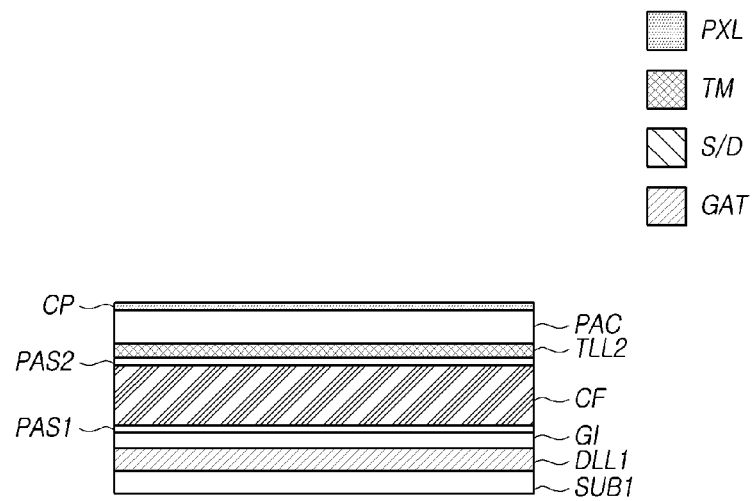
FIG. 6 is a diagram illustrating an example of a vertical structure of a touch link line and a data link line disposed on a non-active area of a touch display device according to embodiments of the present disclosure.

FIG. 5 is a diagram illustrating an example of a plane structure of the touch link line TLL and the data link line DLL disposed on the non-active area NA of the touch display device 100 according to embodiments of the present disclosure. FIG. 6 is a diagram illustrating an example of a vertical structure of the touch link line TLL and the data link line DLL disposed on the non-active area NA of the touch display device 100 according to embodiments of the present disclosure.

Referring to FIGS. 5 and 6, the non-active area NA of the display panel 110 can include a link area LA where the plurality of link lines electrically connecting between a signal line disposed on the active area AA and the driving circuit are disposed. The non-active area NA can include a pad area PA where a plurality of pads PAD to which the link line and the driving circuit are electrically connected are disposed. Furthermore, the non-active area NA can include a seal area SA where a sealant SEAL is disposed along an outer edge of the non-active area NA. The sealant SEAL, in some cases, can be located on an area overlapping with a portion of the pad PAD.

The link line disposed on the non-active area NA can include a plurality of data link lines DLL and a plurality of touch link lines TLL.

The data link line DLL can electrically connect between the data line DL disposed on the active area AA and the data driving circuit 130. The touch link line TLL can electrically connect between the touch line TL disposed on the active area AA and the touch driving circuit 200.

The data link line DLL can include a first data link line DLL1 and a second data link line DLL2.

The first data link line DLL1 can be electrically connected to a data pad DPAD.

The second data link line DLL2 can be disposed on a layer different from a layer where the first data link line DLL1 is disposed. And the second data link line DLL2 can electrically connect between the first data link line DLL1 and the data line DL.

For example, the first data link line DLL1 can be made of the gate metal GAT. The second data link line DLL2 can be made of the source/drain metal S/D.

The first data link line DLL1 and the second data link line DLL2 can be electrically connected by a data link connection pattern DLL_CP. The data link connection pattern DLL_CP, for example, can be made of the pixel metal PXL.

The touch link line TLL can include a first touch link line TLL1 and a second touch link line TLL2.

The first touch link line TLL1 can be electrically connected to a touch pad TPAD.

The second touch link line TLL2 can be disposed on a layer different from a layer where the first touch link line TLL1 is disposed. Furthermore, the second touch link line TLL2 can be disposed on a layer different from a layer where the data link line DLL is disposed. The second touch link line TLL2 can electrically connect the first touch link line TLL1 and the touch line TL.

For example, the first touch link line TLL1 can be made of the gate metal GAT. The second touch link line TLL2 can be made of a touch metal TM.

The touch metal TM can be a metal disposed on an upper layer than the gate metal GAT or the source/drain metal S/D. The touch metal TM can be located on an upper layer than the pixel metal PXL, or can be located on a lower layer than the pixel metal PXL. In this specification, the case that the touch metal TM is located on the lower layer than the pixel metal PXL is described as an example.

The first touch link line TLL1 and the second touch link line TLL2 can be electrically connected by a touch link connection pattern TLL_CP. The touch link connection pattern TLL_CP, for example, can be made of the pixel metal PXL.

Such as described above, the first data link line DLL1 and the first touch link line TLL1 can be made of a same metal and can be disposed on a same layer.

Each of the first data link line DLL1 and the first touch link line TLL1 can be connected to the data pad DPAD and the touch pad TPAD, and the data pad DPAD and the touch pad TPAD can be disposed on a same layer for an electrical connection to the driving circuit. Thus, as disposing the first data link line DLL1 and the first touch link line TLL1 by using a metal disposed on a same layer, a structure connected to the pad PAD can be implemented easily.

The first data link line DLL1 can be disposed on both sides of an area where the first touch link line TLL1 is disposed. The first touch link line TLL1 can be disposed between an area where two or more first data link lines DLL1 are disposed adjacently and another area where other two or more first data link line DLL1 are disposed adjacently.

Thus, the plurality of data pads DPAD can be disposed on both sides of an area where the plurality of touch pads TPAD are disposed.

Since the first data link line DLL1 is disposed on both sides of the first touch link line TLL1, an entire length of the data link line DLL can be reduced. Since the length of the data link line DLL is reduced, a resistance of the data line DL supplied with the data voltage Vdata can be reduced.

The second touch link line TLL2 can be disposed on a layer different from a layer where the first touch link line TLL1 and the first data link line DLL1 are disposed.

Furthermore, the second touch link line TLL2 can be disposed on a layer different from a layer where the second data link line DLL2 is disposed.

Since the first data link line DLL1 and the first touch link line TLL1 are electrically connected to the driving circuit, link lines of same type can be disposed adjacent to each other.

Thus, even in the case that the first data link line DLL1 and the first touch link line TLL1 are implemented by using a metal disposed on a same layer, they can be disposed not to overlap each other.

On the other hand, the data line DL and the touch line TL disposed on the active area AA can be disposed alternatively. Thus, the second touch link line TLL2 electrically connected to the touch line TL can cross the first data link line DLL1 electrically connected to the data line DL on the link area LA.

As embodiments of the present disclosure implement the second touch link line TLL2 which is a portion of the touch link line TLL by using a metal disposed on a layer different from a layer where the first data link line DLL1 is disposed, and provide a structure that the touch link line TLL and the data link line DLL can cross to be disposed on the link area LA.

As disposing a point where the second touch link line TLL2 is connected to the first touch link line TLL1 and a point where the second data link line DLL2 is connected to the first data link line DLL1 to be apart from each other, a structure in which the link line is made of metals disposed on a plurality of layers can be implemented easily.

For example, a point where the first touch link line TLL1 and the second touch link line TLL2 are connected can be located adjacently to the pad area PA. The touch link connection pattern TLL_CP can be located adjacently to the pad area PA.

A point where the first data link line DLL1 and the second data link line DLL2 are connected can be located adjacently to the active area AA. The data link connection pattern DLL_CP can be located adjacently to the active area AA, and can be located between a boundary of the active area AA and the touch link connection pattern TLL_CP.

As described above, by separating an area where the touch link connection pattern TLL_CP is disposed and an area where the data link connection pattern DLL_CP is disposed, different types of link lines made of metals disposed on different layers can be disposed easily.

Furthermore, for reducing the parasitic capacitance between the second touch link line TLL2 and the first data link line DLL1, a color filter layer CF can be disposed between the second touch link line TLL2 and the first data link line DLL1.

For example, referring to FIG. 6, a layer where the first data link line DLL1 is disposed can be located on a first substrate SUB1 on the non-active area NA. A gate insulating layer GI and a first passivation layer PAS1 can be located on the first data link line DLL1.

The color filter layer CF and a second passivation layer PAS2 can be located on the first passivation layer PAS1, and a layer where the second touch link line TLL2 is disposed can be located on the second passivation layer PAS2.

A planarization layer PAC and a layer where a connection pattern CP is disposed can be located on the layer where the second touch link line TLL2 is disposed. For example, in area 1006 in FIG. 5, an area where a portion of the planarization layer PAC is removed can be present. At least a portion of the pad PAD can be located on the area where the portion of the planarization layer PAC is removed.

As a result of disposing the color filter layer CF which is relatively thick between the second touch link line TLL2 and the first data link line DLL1, a distance between the second touch link line TLL2 and the first data link line DLL1 can increase.

The color filter layer CF disposed between the second touch link line TLL2 and the first data link line DLL1 can be a single layer, in some cases, can be made as a plurality of layers.

Furthermore, the color filter layer CF on the non-active area NA can be disposed by extending a color filter layer CF disposed on the active area AA.

As the distance between the second touch link line TLL2 and the first data link line DLL1 increases, even though the second touch link line TLL2 and the first data link line DLL1 overlap and cross each other, the parasitic capacitance between the second touch link line TLL2 and the first data link line DLL1 can be reduced.

Thus, increase of the noise of the touch sensing is prevented or at least reduced due to a portion of the second touch link line TLL2 overlaps with the first data link line DLL1 on the link area LA.

FIGS. 7A, 7B, 8A, 8B and 8C are diagrams illustrating examples of a cross-sectional structure on various areas of the non-active area NA illustrated in FIG. 5 according to embodiments of the disclosure.

Figure 7A:
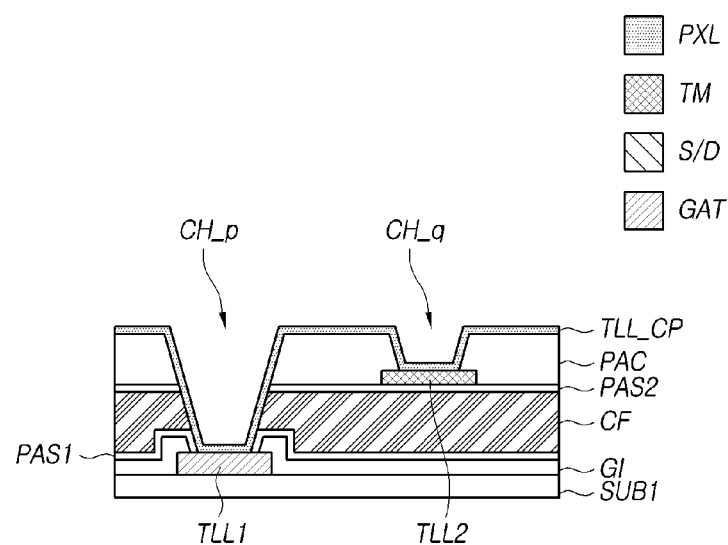
FIGS. 7A, 7B, 8A, 8B, and 8C are diagrams illustrating examples of a cross-sectional structure on various areas of the non-active area illustrated in FIG. 5 according to embodiments of the present disclosure.

Referring to FIG. 7A, it illustrates an example of a cross-sectional structure of an area indicated by 1007 in FIG. 5, and illustrates an example of a cross-sectional structure of an area where the first touch link line TLL1 and the second touch link line TLL2 are connected.

The first touch link line TLL1 can be made of the gate metal GAT, and the second touch link line TLL2 can be made of the touch metal TM. And the color filter layer CF can be located between the first touch link line TLL1 and the second touch link line TLL2.

The first touch link line TLL1 and the second touch link line TLL2 can be electrically connected by the touch link connection pattern TLL_CP made of the pixel metal PXL.

For example, the touch link connection pattern TLL_CP can be connected to the first touch link line TLL1 through a contact-hole CH_p in the planarization layer PAC and the color filter layer CF. And the touch link connection pattern TLL_CP can be connected to the second touch link line TLL2 through a contact-hole CH_q in the planarization layer PAC.

Figure 7B:
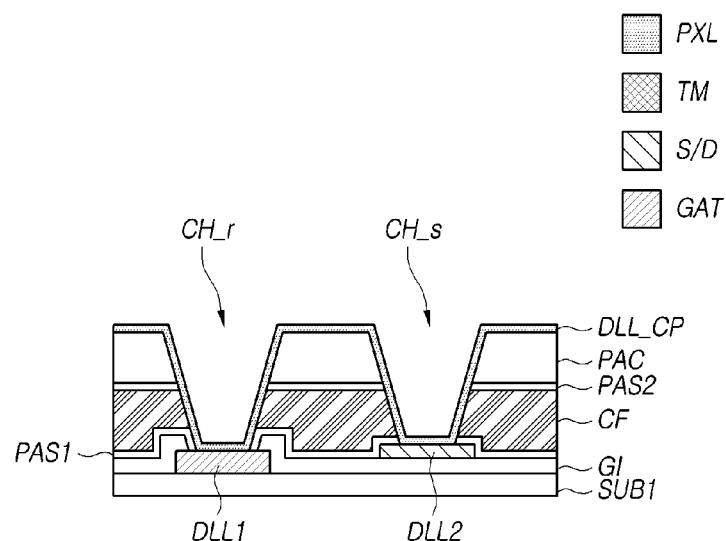

Referring to FIG. 7B, it illustrates an example of a cross-sectional structure of an area indicated by 1008 in FIG. 5, and illustrates an example of a cross-sectional structure of an area where the first data link line DLL1 and the second data link line DLL2 are connected.

The first data link line DLL1 can be made of the gate metal GAT, and the second data link line DLL2 can be made of the source/drain metal S/D.

The color filter layer CF can be located on the first data link line DLL1 and the second data link line DLL2. The planarization layer PAC can be located on the color filter layer CF.

The data link connection pattern DLL_CP can be connected to the first data link line DLL1 through a contact-hole CH_r in the planarization layer PAC and the color filter layer CF. Furthermore, the data link connection pattern DLL_CP can be connected to the second data link line DLL2 through a contact-hole CH_s in the planarization layer PAC and the color filter layer CF.

Thus, even though the color filter layer CF is disposed on the link area LA, a connection structure of the touch link line TLL and a connection structure of the data link line DLL can be implemented easily.

Furthermore, a vertical distance between the touch link line TLL and the data link line DLL can increase by an arrangement of the color filter layer CF.

Figure 8A:
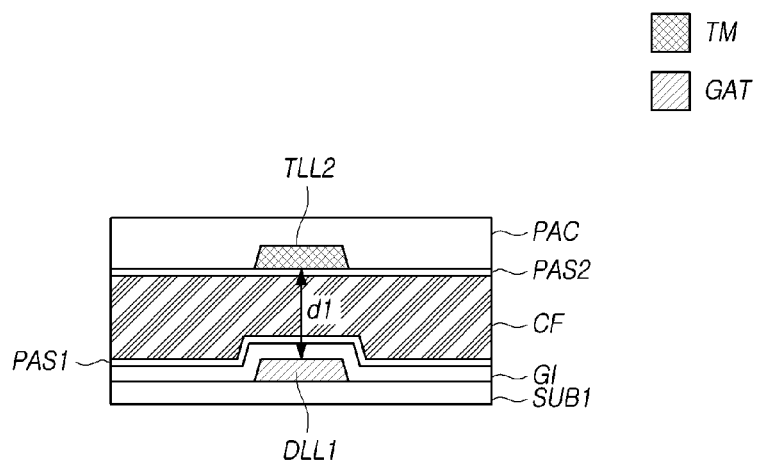
Figure 8B:
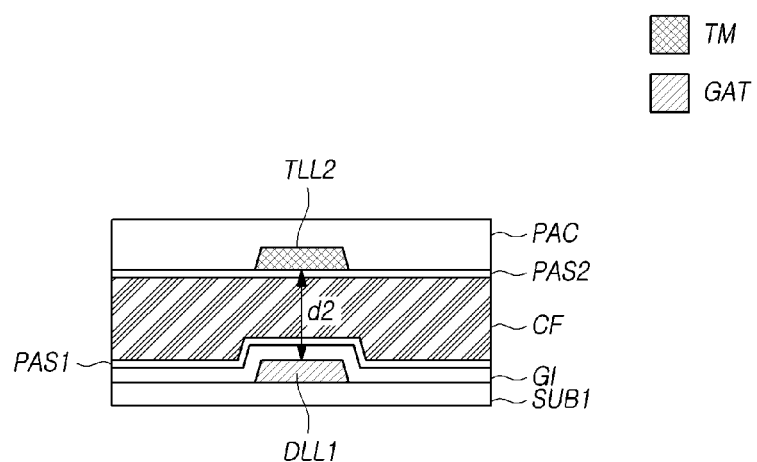

Referring to FIGS. 8A and 8B, FIG. 8A illustrates an example of a cross-sectional structure of an area indicated by 1009 in FIG. 5, and FIG. 8B illustrates an example of a cross-sectional structure of an area indicated by 1010 in FIG. 5 according to one embodiment.

All of FIGS. 8A and 8B illustrate an area where the touch link line TLL and the data link line DLL cross, FIG. 8A illustrates an example of a cross-sectional structure on the seal area SA, and FIG. 8B illustrates an example of a cross-sectional structure on the link area LA. In the cross-sectional structure of FIG. 8A illustrating the example of the cross-sectional structure on the seal area SA, the sealant SEAL located on the planarization layer PAC is not illustrated and described.

Such as the example illustrated in FIG. 8A, a distance between the second touch link line TLL2 and the first data link line DLL1 on the seal area SA can be d1. And such as the example illustrated in FIG. 8B, a distance between the second touch link line TLL2 and the first data link line DLL1 on the link area LA can be d2.

Here, d1 and d2 can be same or similar.

By disposing the color filter layer CF to be same or similar on the link area LA and the seal area SA, a distance between the second touch link line TLL2 and the first data link line DLL1 can be maintained constantly and the parasitic capacitance can be reduced.

Alternatively, in some cases, a thickness of the color filter layer CF located on the seal area SA can be smaller than a thickness of the color filter layer CF located on the link area LA. In this case, d1 can be smaller than d2. The color filter layer CF can be disposed as a structure inclined.

Alternatively, in some cases, a thickness of the color filter layer CF located on the seal area SA can be greater than a thickness of the color filter layer CF located on the link area LA. As increasing a thickness of the color filter layer CF located on the seal area SA, the parasitic capacitance can be reduced on an area where a density of the second touch link line TLL2 and the first data link line DLL1 is high.

A thickness of the color filter layer CF can be adjusted by disposing a single color filter pigment thickly, or disposing a plurality of color filter layers CF.

Figure 8C:
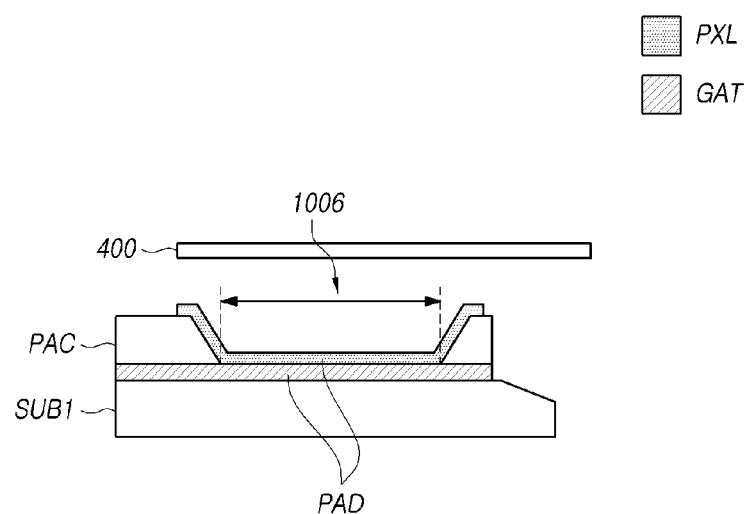

FIG. 8C illustrates an example of a cross-sectional structure of the pad area PA in FIG. 5 according to one embodiment.

The color filter layer CF may not be disposed on the pad area PA, and an area where the planarization layer PAC is removed can be present.

The gate metal GAT and the pixel metal PXL can contact each other to constitute the pad PAD on an area where the planarization layer PAC is removed. And the pad PAD disposed on the display panel 110 can be electrically connected to a pad of the driving circuit made on the film 400.

By removing a portion of the planarization layer PAC and contacting the pad PAD of the display panel 110 and the pad of the driving circuit, contacts between pads can be made easily comparing to a structure that a hole is made in the planarization layer PAC.

Figure 9:
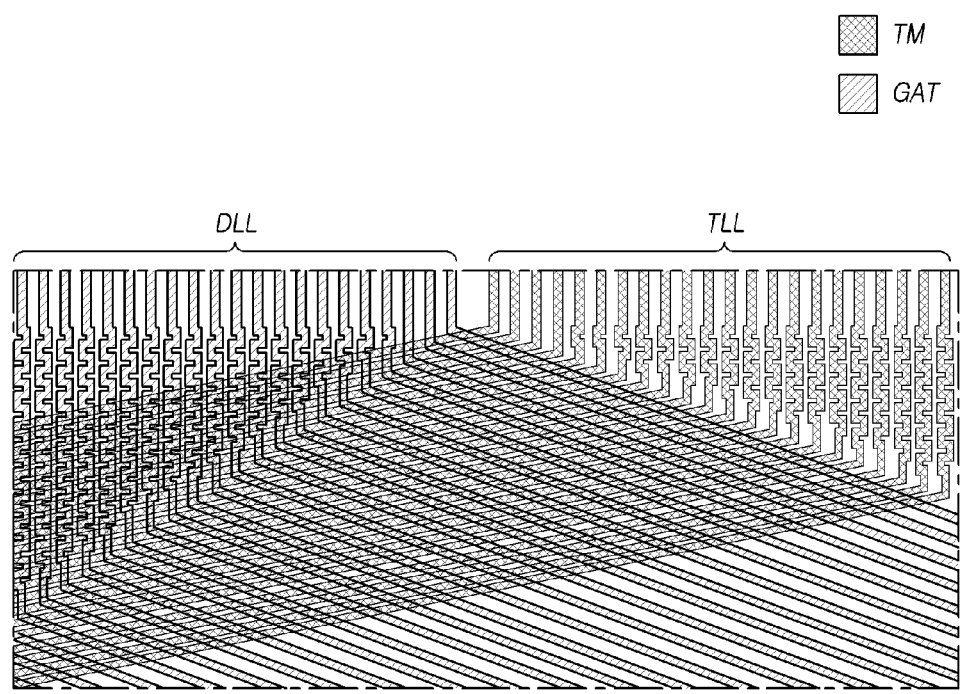
FIG. 9 is a diagram illustrating an example of a plane structure enlarging an area where the touch link line and the data link line overlap on the non-active area illustrated in FIG. 5 according to embodiments of the present disclosure.

FIG. 9 is a diagram illustrating an example of a plane structure enlarging an area where the touch link line TLL and the data link line DLL overlap on the non-active area NA illustrated in FIG. 5 according to one embodiment.

Referring to FIG. 9, it illustrates an example of a plane structure enlarging an area indicated by 1011 in FIG. 5.

The first data link line DLL1 made of the gate metal GAT and the second touch link line TLL2 made of the touch metal TM located on an upper layer than the gate metal GAT can be disposed to cross each other.

As the first data link line DLL1 and the second touch link line TLL2 include curved portions, a resistance variation according to a length variation between the link lines can be compensated.

For example, by increasing a ratio of the curved portions of the link line in a case that a length of the link line connecting between the driving circuit and the signal line is small, and by decreasing a ratio of the curved portions of the link line in a case that a length of the link line is great, the length variation between the link lines can be reduced.

Since at least one color filter layer CF is disposed between the first data link line DLL1 and the second touch link line TLL2, the parasitic capacitance between the first data link line DLL1 and the second touch link line TLL2 can be reduced.

Figure 10A:
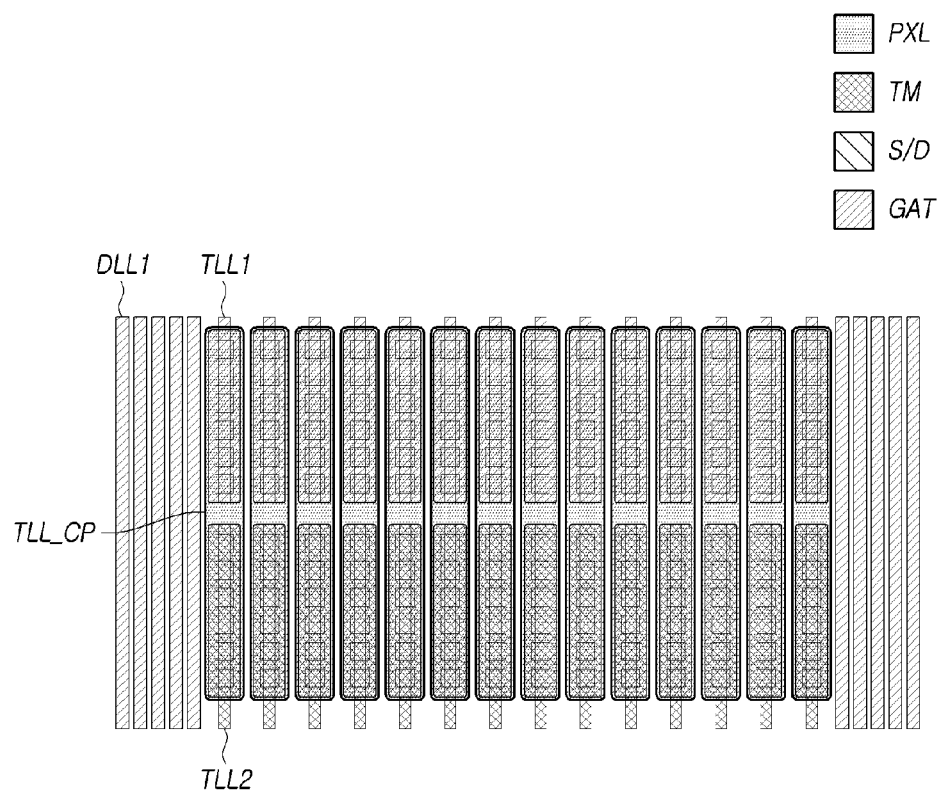
FIGS. 10A and 10B are diagrams illustrating examples of a plane structure enlarging an area where a touch link connection pattern is disposed and an area where a data link connection pattern is disposed on the non-active area illustrated in FIG. 5.
Figure 10B:
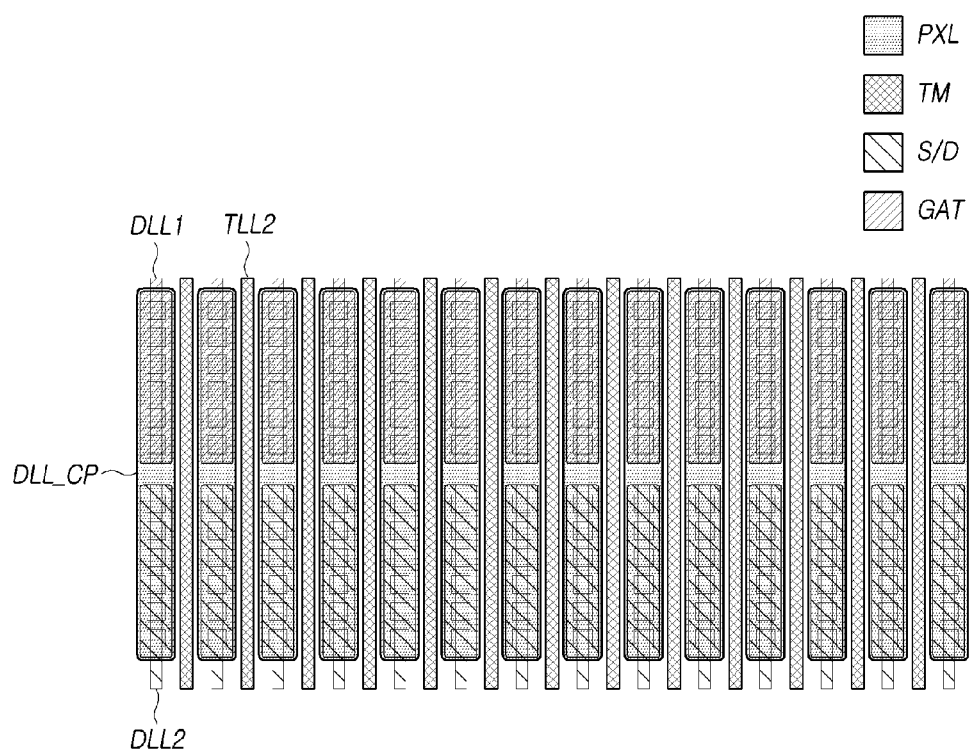

FIGS. 10A and 10B are diagrams illustrating examples of a plane structure enlarging an area where the touch link connection pattern TLL_CP is disposed and an area where the data link connection pattern DLL_CP is disposed on the non-active area NA illustrated in FIG. 5.

Referring to FIG. 10A, the first touch link line TLL1 made of the gate metal GAT and the second touch link line TLL2 made of the touch metal TM can be disposed on an area where the touch link connection pattern TLL_CP is disposed. The first touch link line TLL1 and the second touch link line TLL2 can be electrically connected by the pixel metal PXL located on an upper layer than the gate metal GAT or the touch metal TM.

The first data link line DLL1 made of the gate metal GAT can be disposed on both sides of an area where the touch link connection pattern TLL_CP is disposed.

Referring to FIG. 10B, the first data link line DLL1 made of the gate metal GAT and the second data link line DLL2 made of the source/drain metal S/D can be disposed on an area where the data link connection pattern DLL_CP is disposed. The first data link line DLL1 and the second data link line DLL2 can be electrically connected by the pixel metal PXL located on an upper layer than the gate metal GAT or the source/drain metal S/D.

The second touch link line TLL2 made of the touch metal TM can be disposed to alternate with the data link connection pattern DLL_CP.

As an area illustrated in FIG. 10B is an area where the link line directly connected to the data line DL and the touch line TL disposed on the active area AA is disposed, the data link line DLL and the touch link line TLL can be alternated to be disposed such as a structure that the data line DL and the touch line TL are disposed on the active area AA.

FIGS. 11A to 11G are diagrams illustrating examples of a cross-sectional structure of the active area AA and the non-active area NA of the touch display device 100 according to embodiments of the present disclosure.

The active area AA illustrated in FIGS. 11A to 11G illustrates examples of a cross-sectional structure of a portion I-I' where the driving transistor DRT is disposed on the subpixel SP illustrated in FIG. 4A, and a cross-sectional structure of a portion II-II' where the data line DL and the touch line TL are disposed. And the non-active area NA illustrated in FIGS. 11A to 11G illustrates an example of a cross-sectional structure of the link area LA, the seal area SA and the pad area PA illustrated in FIG. 5.

Referring to FIG. 11A, a buffer layer BUF can be disposed on the first substrate SUB1. Various electrodes and signal lines made of the gate metal GAT can be disposed on the buffer layer BUF.

For example, the gate electrode GE of the driving transistor DRT disposed on the subpixel SP and the sub touch electrode TE_s can be made of the gate metal GAT. And the first data link line DLL1 and the pad PAD disposed on the non-active area NA can be made of the gate metal GAT.

Although it is not illustrated in FIG. 11A, the first touch link line TLL1 made of the gate metal GAT can be disposed on the seal area SA. The pad PAD illustrated in FIG. 11A can be the touch pad TPAD, or can be the data pad DPAD.

Figure 11B:
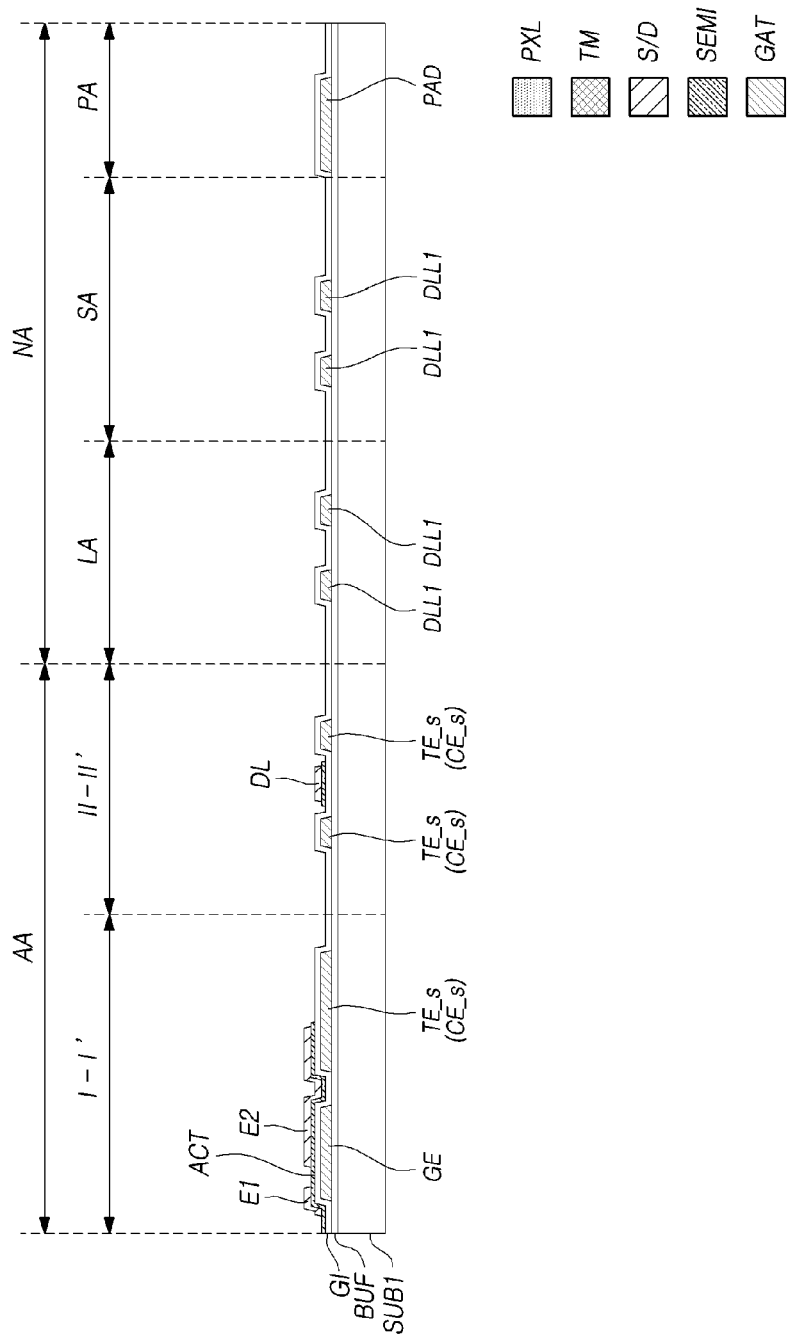

Referring to FIG. 11B, after various electrodes and signal lines are disposed by using the gate metal GAT, the gate insulating layer GI can be disposed on the electrodes and the signal lines made of the gate metal GAT.

An active layer ACT made as a channel of the driving transistor DRT can be disposed on the gate insulating layer GI. The active layer ACT can be made of a semiconductor material SEMI.

The first electrode E1 and the second electrode E2 of the driving transistor DRT can be disposed on the active layer ACT. The first electrode E1 and the second electrode E2 can be made of the source/drain metal S/D.

Furthermore, the data line DL made of the source/drain metal S/D can be disposed. The semiconductor material SEMI can become a conductor disposed under the data line DL, a resistance of the data line DL can be reduced.

Figure 11C:
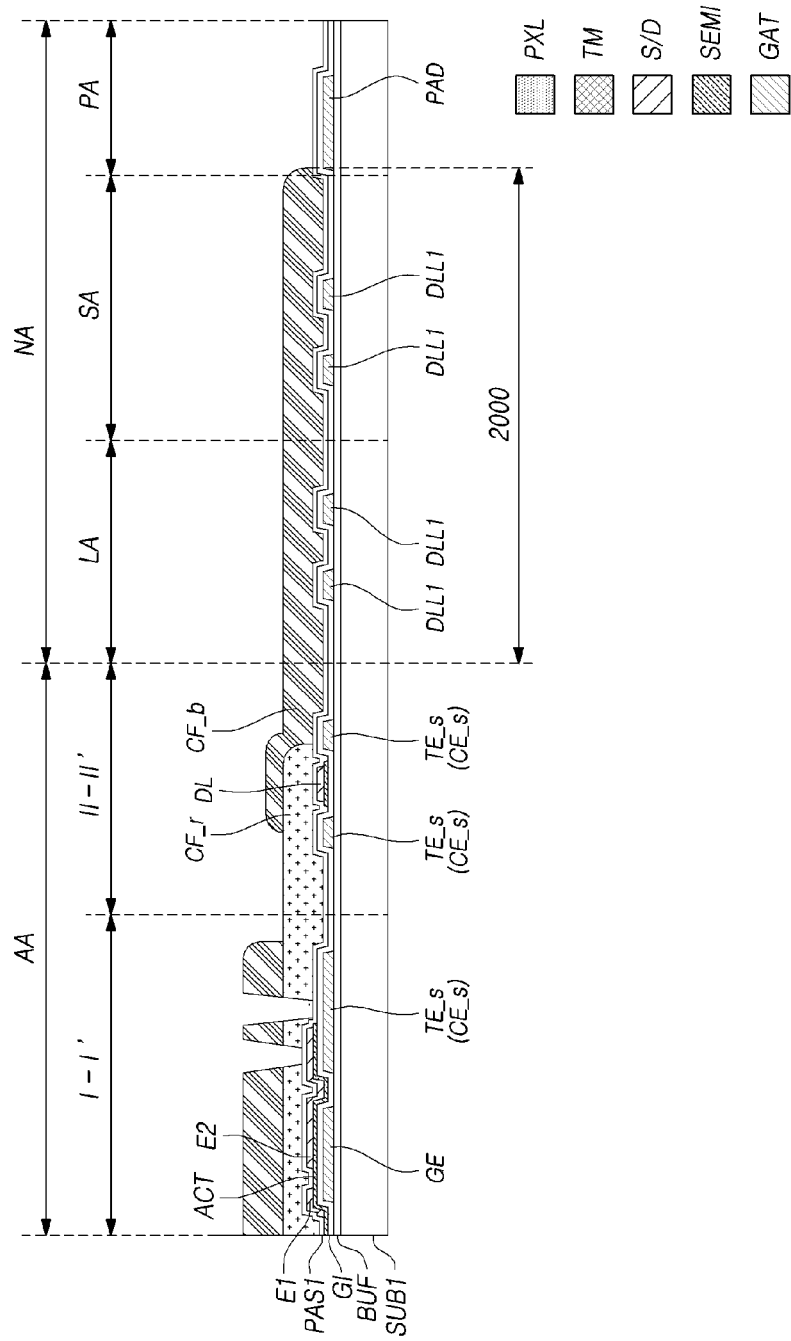

Referring to FIG. 11C, the at least one color filter layer CF can be disposed on the driving transistor DRT and the data line DL on the active area AA. Furthermore, the at least one color filter layer CF can be disposed on the first data link line DLL1 on the non-active area NA.

The touch display device 100 according to embodiments of the present disclosure can have a structure that the color filter layer CF is disposed on the first substrate SUB1 where the driving transistor DRT is disposed. And such as an area indicated by 2000 illustrated in FIG. 11C, the color filter layer CF disposed on the active area AA can be extended to be disposed on the non-active area NA.

The color filter layer CF disposed on the non-active area NA can be disposed on at least a part area of the link area LA, the seal area SA and the pad area PA. The color filter layer CF can be disposed on an area including an area where the second touch link line TLL2 and the first data link line DLL1 are disposed among the non-active area NA.

The color filter layer CF disposed on the non-active area NA can be a single layer, or can be multiple layers.

The color filter layer CF, for example, can be disposed as a single layer on the non-active area NA, and can be disposed as a single layer on the active area AA according to a color that each subpixel SP represents. The color filter layer CF disposed on the non-active area NA can be a blue color filter layer CF_b.

A plurality of color filter layers CF can be disposed on an area where the data line DL is disposed on the active area AA. For example, such as an example illustrated in FIG. 11C, a red color filter layer CF_r and the blue color filter layer CF_b can be laminated on the data line DL.

As the plurality of color filter layers CF are disposed on the data line DL, a light-leakage can be prevented or at least reduced at a boundary of the subpixel SP.

Furthermore, as the color filter layer CF is disposed on the non-active area NA, the light-leakage on the non-active area NA can be prevented or at least reduced.

In a case of the touch display device 100, as the touch link line TLL is disposed on the non-active area NA additionally, an electric field made by the touch link line TLL can influence the driving of a liquid crystal layer. Thus, the light-leakage can occur on the non-active area NA, but by disposing the color filter layer CF on the non-active area NA, the light-leakage can be prevented or at least reduced on an area where the touch link line TLL is disposed.

According to embodiments of the present disclosure, by disposing the color filter layer CF between the touch link line TLL and the data link line DLL on the non-active area NA, the light-leakage which can be occurred due to an arrangement of the touch link line TLL can be prevented or at least reduced while reducing the parasitic capacitance.

Figure 11D:
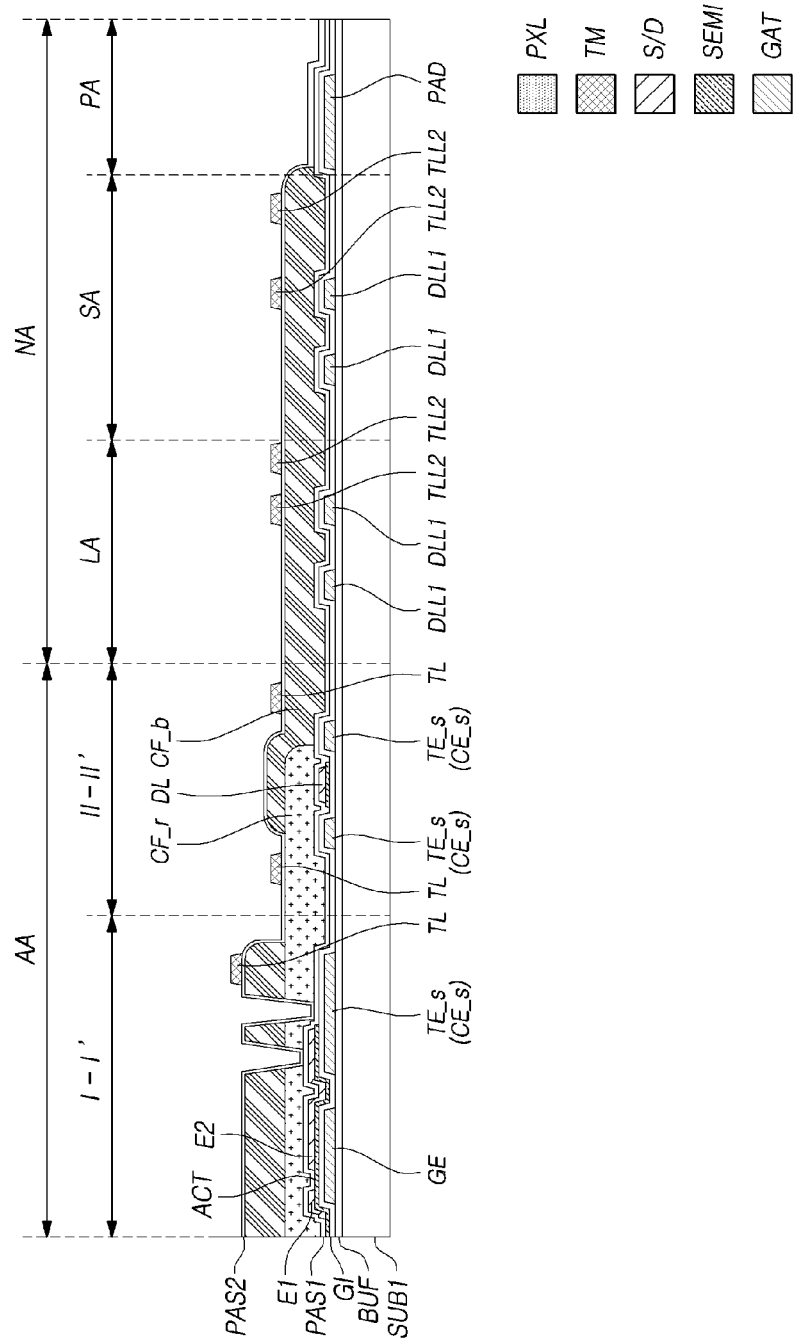

Referring to FIG. 11D, the second passivation layer PAS2 and the touch line TL and the second touch link line TLL2 made of the touch metal TM can be disposed on the color filter layer CF. The touch line TL can be disposed on the active area AA, and the second touch link line TLL2 can be disposed on the link area LA and the seal area SA.

Figure 11E:
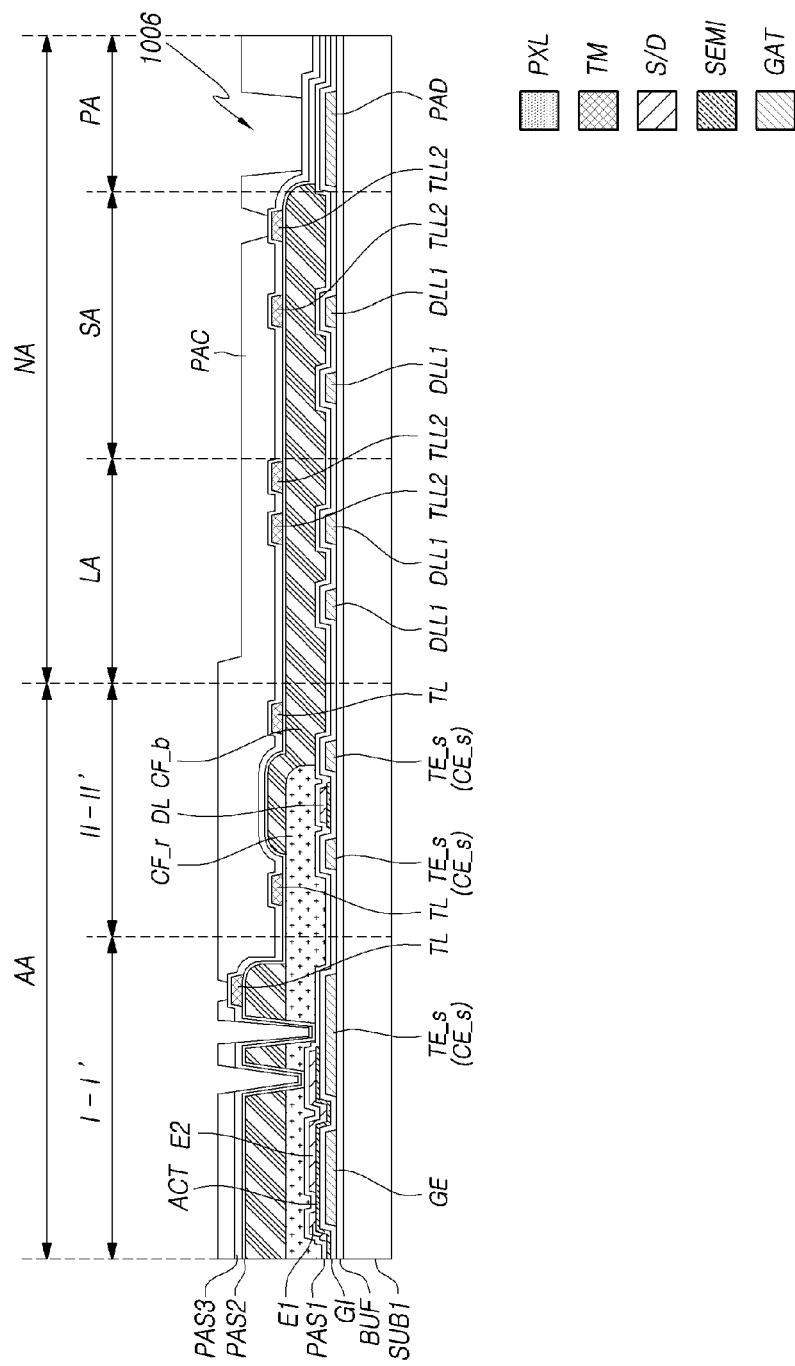

Referring to FIG. 11E, a third passivation layer PAS3 and the planarization layer PAC can be disposed on a layer where the touch metal TM is disposed.

The planarization layer PAC can include a contact-hole located on an area requiring for an electrical connection of the electrode or the signal line. The contact-hole can be located on the active area AA, or can be located on the link area LA or the seal area SA among the non-active area NA.

A portion of the planarization layer PAC can be removed on the pad area PA.

Such as an area indicated by 1006 illustrated in FIG. 11E, as the planarization layer PAC located on at least a part area among an area overlapping with the pad PAD is removed, an electrical connection between the pad PAD of the display panel 110 and the driving circuit can be made easily.

Figure 11F:
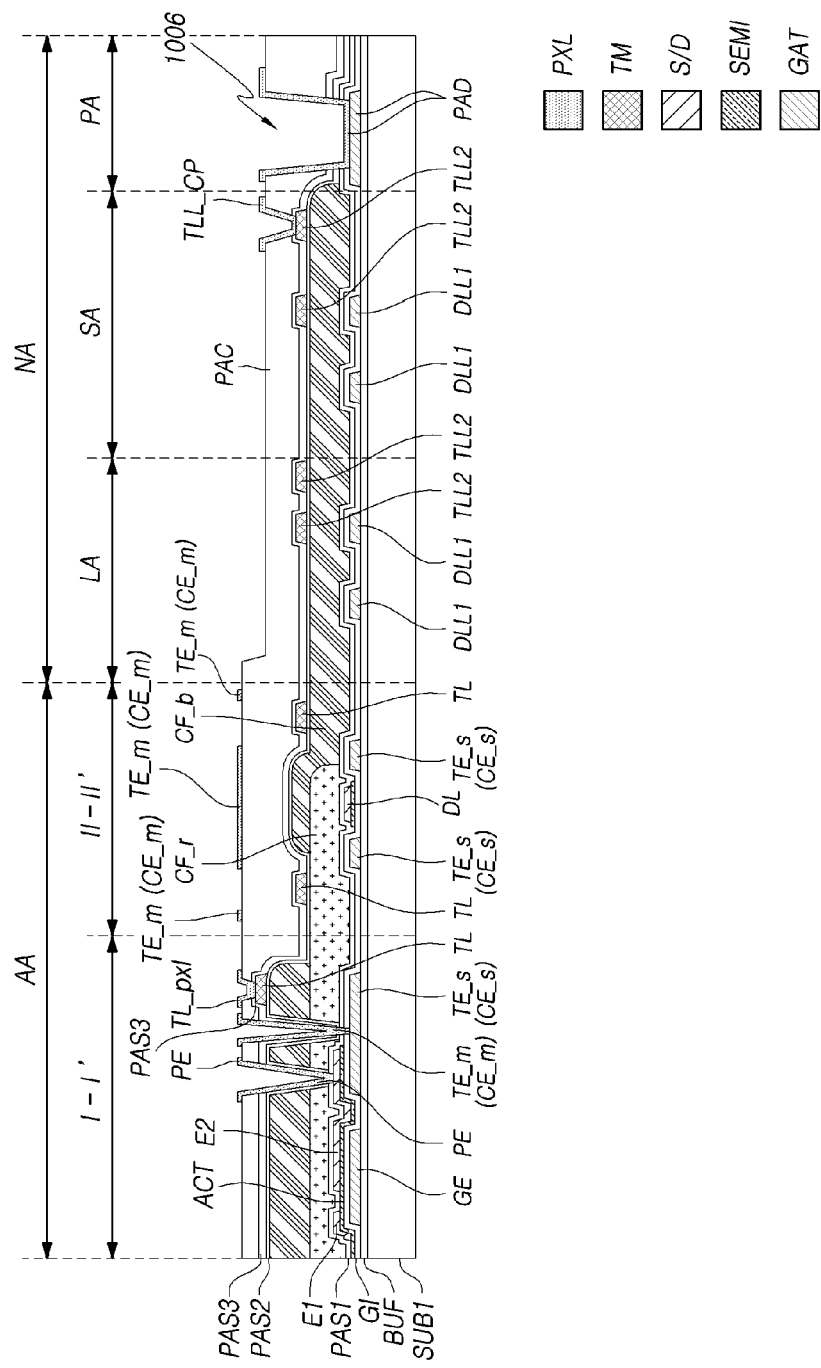

Referring to FIG. 11F, the pixel electrode PE and the main touch electrode TE_m made of the pixel metal PXL can be disposed on the planarization layer PAC. Furthermore, the touch line part TL_pxl connected to the touch line TL can be disposed. The touch line part TL_pxl can be connected to the main touch electrode TE_m disposed adjacently. Alternatively, the touch line part TL_pxl may not be connected to the main touch electrode TE_m disposed adjacently, in a case that the touch line TL connected to the touch line part TL_pxl is electrically connected to the main touch electrode TE_m disposed on other area.

The pixel electrode PE can be electrically connected to the second electrode E2 of the driving transistor DRT through a contact-hole in the planarization layer PAC and the color filter layer CF.

The main touch electrode TE_m can be electrically connected to the sub touch electrode TE_s through a contact-hole in the planarization layer PAC and the color filter layer CF. Furthermore, the main touch electrode TE_m can be electrically connected to the touch line TL driving the main touch electrode TE_m through a contact-hole in the planarization layer PAC.

Figure 11G:
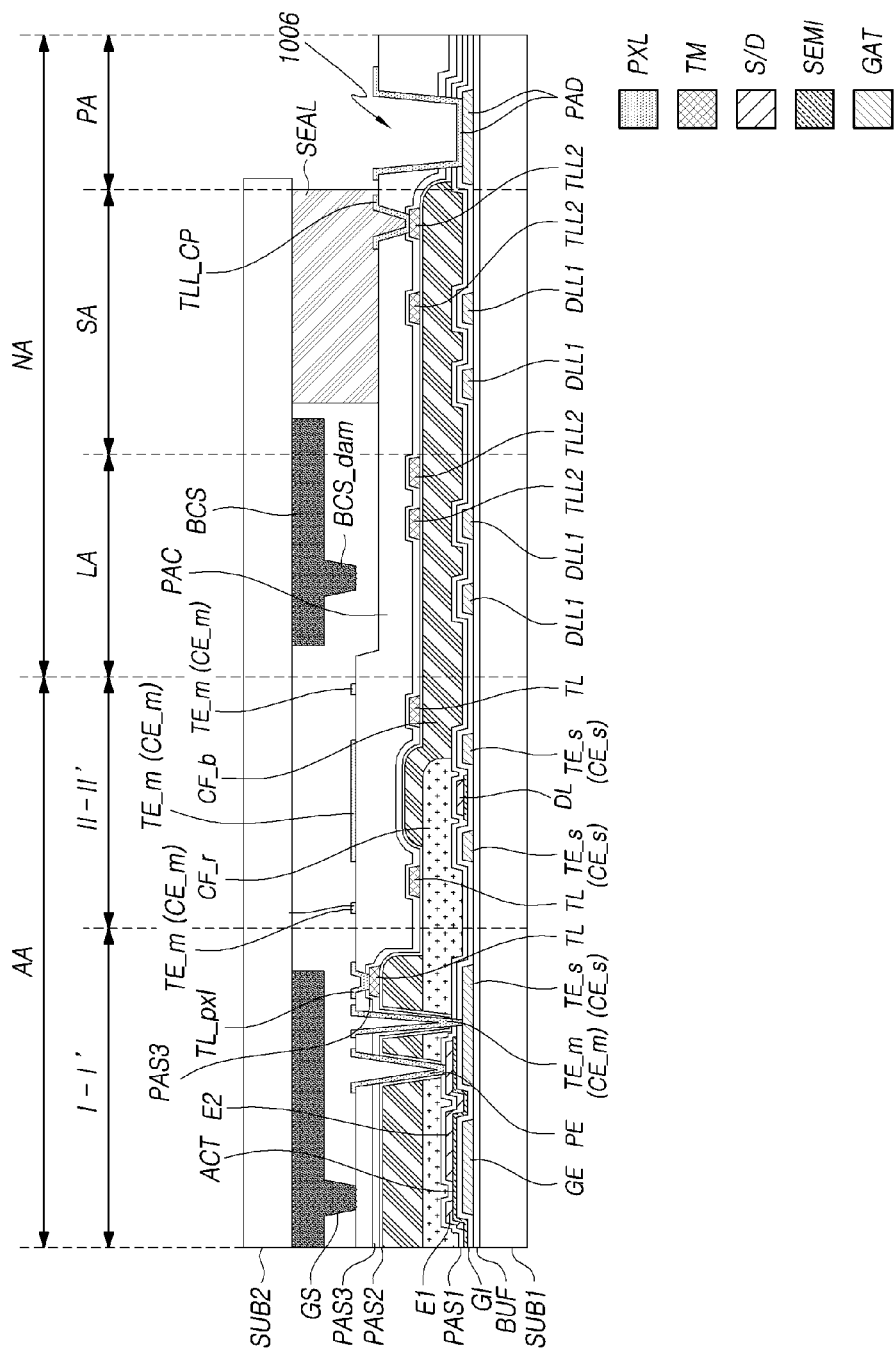

Referring to FIG. 11G, the sealant SEAL can be disposed on the planarization layer PAC. A second substrate SUB2 can be disposed on the sealant SEAL. Although not illustrated in FIG. 11G, the liquid crystal layer can be located between the planarization layer PAC and the second substrate SUB2.

A spacer for maintaining a gap or blocking the light-leakage can be disposed on a bottom surface of the second substrate SUB2.

For example, a gap spacer GS for maintaining a gap between the second substrate SUB2 and the planarization layer PAC can be disposed on an area corresponding to the active area AA among the bottom surface of the second substrate SUB2.

A black column spacer BCS for blocking the light-leakage can be disposed on an area corresponding to the non-active area NA among the bottom surface of the second substrate SUB2. And the black column spacer BCS can include a dam BCS_dam protruding toward the planarization layer PAC. The dam BCS_dam of the black column spacer BCS can alleviate or prevent an overflow of the liquid crystal layer disposed on the active area AA.

The black column spacer BCS can be disposed to overlap with at least a portion of the color filter layer CF disposed on the non-active area NA. The black column spacer BCS can block a light of a specific wavelength band.

For example, the black column spacer BCS can block a light of a short wavelength band such as a blue light. Alternatively, in some cases, the black column spacer BCS can block a green light, or can block a light of a long wavelength band such as a red light.

In the case that the black column space BCS blocks a light of the short wavelength band, the blue color filter layer CF_b can be disposed between the touch link line TLL and the data link line DLL on the non-active area NA.

As blocking a light of the long wavelength band by the blue color filter layer CF_b and blocking a light of the short wavelength band by the black column spacer BCS, it can be effectively prevented that the light-leakage occurs on an area where the touch link line TLL is disposed among the non-active area NA.

Figure 12:
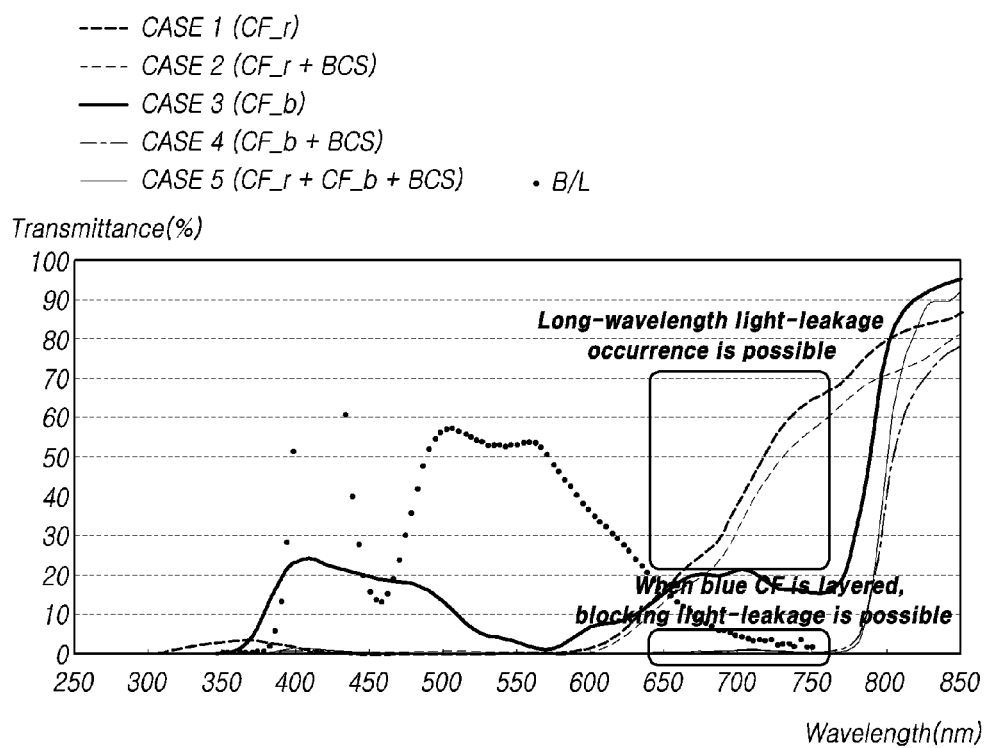
FIG. 12 is a diagram illustrating an example of a result measuring a light-leakage depending on an arrangement structure of a color filter layer on an area where a touch link line is disposed in a touch display device according to embodiments of the present disclosure.

FIG. 12 is a diagram illustrating an example of a result measuring the light-leakage depending on an arrangement structure of the color filter layer CF on an area where the touch link line TLL is disposed in the touch display device 100 according to embodiments of the present disclosure.

Referring to FIG. 12, CASE 1 represents a transmittance for each wavelength of a back light B/L in a case that the red color filter layer CF_r is disposed on an area where the touch link line TLL is disposed. And CASE 2 represents a transmittance for each wavelength of the back light B/L in a case that the red color filter layer CF_r and the black column spacer BCS are disposed on an area where the touch link line TLL is disposed. CASE 3 represents a transmittance for each wavelength of the back light B/L in a case that the blue color filter layer CF_b is only disposed on an area where the touch link line TLL is disposed.

Such as represented in CASE 1, CASE 2 illustrated in FIG. 12, it can be seen that the light-leakage occurs in the long wavelength band. In CASE 3, the light-leakage in the long wavelength band is reduced but still occurred. Furthermore, in CASE 3, it can be seen that the light-leakage occurs in the short wavelength band.

On the other hand, in a case of CASE 4 that the blue color filter layer CF_b and the black column spacer BCS are disposed on an area where the touch link line TLL is disposed, it can be seen that the light-leakage doesn't occur in the long wavelength band.

Furthermore, such as CASE 5, in a case that the red color filter layer CF_r, the blue color filter layer CF_b and the black column spacer BCS are disposed on an area where the touch link line TLL is disposed, it can be seen that the light-leakage doesn't occur in the long wavelength band.

As light-leakage blocking effects of CASE 4 and CASE 5 are similar, the light-leakage can be blocked by disposed only the blue color filter layer CF_b on an area where the touch link line TLL is disposed. Alternatively, while blocking the light-leakage by laminating the red color filter layer CF_r and the blue color filter layer CF_b, the parasitic capacitance between the touch link line TLL and the data link line DLL can be reduced by increasing a thickness of the color filter layer CF.

Considering a light transmitting/blocking characteristic of the black column spacer BCS disposed on the touch link line TLL and a dropping level of the parasitic capacitance of the touch link line TLL, the color filter layer CF can be disposed on the non-active area NA as various structures.

According to embodiments of the present disclosure described above, as implementing a portion of the touch link line TLL by using a metal disposed on a layer different from a layer where the data link line DLL is disposed, it can be provided methods that the plurality of link lines are disposed effectively on the link area LA of the touch display device 100.

Furthermore, as disposing the color filter layer CF between the touch link line TLL and the data link line DLL on the non-active area NA, the parasitic capacitance between the touch link line TLL and the data link line DLL can be reduced.

Furthermore, as blocking a light of a specific wavelength band by the color filter layer CF disposed on the non-active area NA, the light-leakage due to an abnormal driving of the liquid crystal layer according to the driving of the touch link line TLL can be prevented on an area where the touch link line TLL is disposed.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. A touch display device, comprising:
   a plurality of touch electrodes and a plurality of touch lines disposed on an active area of a display panel;
   a plurality of touch pads and a plurality of data pads disposed on a non-active area of the display panel, the non-active area located outside of the active area;
   a plurality of touch link lines disposed on the non-active area; and
   a plurality of data link lines disposed on the non-active area,
   wherein each the plurality of touch link lines comprises a first touch link line electrically connected to one of the plurality of touch pads, and a second touch link line disposed on a layer different from a layer where the first touch link line is disposed and electrically connecting the first touch link line and one of the plurality of touch lines,
   wherein each of the plurality of data link lines comprises a first data link line and a second data link line, the second data link line disposed on a layer different from a layer where the first data link line is disposed and electrically connected to the first data link line, and
   wherein a distance between the first touch link line and the second touch link line is greater than a distance between the first data link line and the second data link line.

2. The touch display device of claim 1, wherein the first touch link line is disposed on a layer where the first data link line is disposed.

3. The touch display device of claim 1, wherein the second touch link line is disposed on a layer different from a layer where the second data link line is disposed.

4. The touch display device of claim 1, wherein a thickness of an insulating layer disposed between the second data link line and the second touch link line is greater than a thickness of an insulating layer disposed between the second data link line and the first touch link line.

5. The touch display device of claim 1, wherein a number of insulating layers disposed between the second data link line and the second touch link line is greater than a number of insulating layers disposed between the second data link line and the first touch link line.

6. The touch display device of claim 1, wherein a material of at least one insulating layer disposed between the second data link line and the second touch link line is different from a material of at least one insulating layer disposed between the second data link line and the first touch link line.

7. The touch display device of claim 1, wherein the first touch link line is disposed on a layer where the plurality of touch pads are disposed, and is integral with one of the plurality of touch pads.

8. The touch display device of claim 1, wherein the second touch link line is disposed on a layer where the plurality of touch lines are disposed, and is integral with one of the plurality of touch lines.

9. The touch display device of claim 1, wherein a portion of the second touch link line overlaps a portion of the first data link line.

10. The touch display device of claim 1, wherein the second touch link line and the second data link line are non-overlapping with each other.

11. The touch display device of claim 1, further comprising:
    a touch link connection pattern electrically connecting the first touch link line and the second touch link line; and
    a data link connection pattern electrically connecting the first data link line and the second data link line.

12. The touch display device of claim 11, wherein the touch link connection pattern is disposed on a layer where the data link connection pattern is disposed.

13. The touch display device of claim 11, wherein the touch link connection pattern and the data link connection pattern are made of a same material as the plurality of touch electrodes.

14. The touch display device of claim 11, wherein the data link connection pattern is located closer to a boundary of the active area than the touch link connection patterns.

15. A touch display device, comprising:
    a substrate;

a plurality of touch electrodes and a plurality of touch lines disposed on a first area of the substrate;

a plurality of touch pads and a plurality of data pads disposed on a second area of the substrate;

a plurality of touch link lines disposed on the second area of the substrate; and a plurality of data link lines disposed on the second area of the substrate, wherein each the plurality of touch link lines comprises a first touch link line electrically connected to one of the plurality of touch pads, and a second touch link line disposed on a layer different from a layer where the first touch link line is disposed and electrically connecting the first touch link line and one of the plurality of touch lines, wherein each of the plurality of data link lines comprises a first data link line and a second data link line, the second data link line disposed on a layer different from a layer where the first data link line is disposed and electrically connected to the first data link line, and wherein a minimum distance between the second touch link line and the substrate is greater than a minimum distance between the second data link line and the substrate.

16. The touch display device of claim 15, wherein a minimum distance between the first touch link line and the substrate is equal to a minimum distance between the first data link line and the substrate.

17. The touch display device of claim 15, wherein at least a portion of the second touch link line overlaps with the first data link line on the second area of the substrate in a plan view.

18. The touch display device of claim 15, wherein the plurality of touch link lines are arranged parallel to the plurality of data link lines on a third area overlapping the second area of the substrate.

19. The touch display device of claim 18, wherein at least one of the plurality of touch link lines is disposed between at least two of the plurality of data link lines on the third area of the substrate in a plan view.

20. The touch display device of claim 18, wherein the plurality of touch link lines are not overlapped with the plurality of data link lines on the third area of the substrate in a plan view.

* * * * *